United States Patent
Wilkinson et al.

(10) Patent No.: US 10,761,979 B2
(45) Date of Patent: Sep. 1, 2020

(54) BIT CHECK PROCESSORS, METHODS, SYSTEMS, AND INSTRUCTIONS TO CHECK A BIT WITH AN INDICATED CHECK BIT VALUE

(71) Applicant: Intel Corporation, Santa Clara, CA (US)

(72) Inventors: Hugh Wilkinson, Newton, MA (US); William R. Wheeler, Southborough, MA (US); Debra Bernstein, Sudbury, MA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/201,303

(22) Filed: Jul. 1, 2016

(65) Prior Publication Data

US 2018/0004655 A1    Jan. 4, 2018

(51) Int. Cl.
*G06F 12/02* (2006.01)
*G06F 9/30* (2018.01)
*G11C 7/10* (2006.01)

(52) U.S. Cl.
CPC ...... *G06F 12/0253* (2013.01); *G06F 9/30018* (2013.01); *G06F 9/30021* (2013.01); *G11C 7/1072* (2013.01); *G06F 2212/702* (2013.01)

(58) Field of Classification Search
CPC ........... G06F 12/0253; G06F 2212/702; G11C 7/1072
See application file for complete search history.

(56) References Cited

U.S. PATENT DOCUMENTS

| | | | |
|---|---|---|---|
| 2004/0024798 A1 | 2/2004 | Chauvel | |
| 2004/0064684 A1* | 4/2004 | Kalluri | G06F 9/30043 712/226 |
| 2005/0047591 A1* | 3/2005 | Liang | G06F 11/1008 380/28 |
| 2008/0046683 A1* | 2/2008 | Codrescu | G06F 9/30021 712/7 |

(Continued)

FOREIGN PATENT DOCUMENTS

| | | |
|---|---|---|
| EP | 1785873 A1 | 5/2007 |
| WO | 2018004969 A1 | 1/2018 |

OTHER PUBLICATIONS

Click C., et al., "The Pauseless GC Algorithm," Jun. 11-12, 2005, VEE'05, 11 pages.

(Continued)

*Primary Examiner* — Tuan V Thai
*Assistant Examiner* — Alexander J Yoon
(74) *Attorney, Agent, or Firm* — NDWE, LLP

(57) ABSTRACT

A processor of an aspect includes a register to store a condition code bit, and a decode unit to decode a bit check instruction. The bit check instruction is to indicate a first source operand that is to include a first bit, and is to indicate a check bit value for the first bit. The processor also includes an execution unit coupled with the decode unit. The execution unit, in response to the bit check instruction, is to compare the first bit with the check bit value, and update a condition code bit to indicate whether the first bit equals or does not equal the check bit value. Other processors, methods, systems, and instructions are disclosed.

24 Claims, 17 Drawing Sheets

(56) References Cited

U.S. PATENT DOCUMENTS

| | | | |
|---|---|---|---|
| 2011/0314263 A1* | 12/2011 | Greiner | G06F 9/3001 |
| | | | 712/221 |
| 2012/0078982 A1 | 3/2012 | Massarenti | |
| 2012/0246437 A1* | 9/2012 | Radovic | G06F 12/02 |
| | | | 711/170 |
| 2013/0086131 A1 | 4/2013 | Hunt et al. | |
| 2013/0097408 A1* | 4/2013 | Seal | G06F 9/30021 |
| | | | 712/208 |
| 2014/0059093 A1 | 2/2014 | Sekiguchi | |
| 2016/0117117 A1 | 4/2016 | Heller, Jr. et al. | |
| 2016/0140036 A1 | 5/2016 | O'Meara et al. | |

OTHER PUBLICATIONS

Gillam R., "An Introduction to Garbage Collection, Part I—the Real Costs of C++ Memory Management," downloaded from http://icu-project.org/docs/papers/cpp_report/an_introduction_to_garbage_collection_part_i.html on May 31, 2016, 10 pages.

Gillam R., "An Introduction to Garbage Collection Part II—A Look Under the Hood," downloaded from http://icu-project.org/docs/papers/cpp_report/an_introduction_to_garbage_collection_part_ii.html on May 31, 2016, 11 pages.

International Search Report and Written Opinion for Application No. PCT/US2017/035395, dated Sep. 8, 2017, 15 pages.

"Java Garbage Collection Basics," downloaded from http://www.oracle.com/webfolder/technetwork/tutorials/obe/java/gc01/index.html on May 24, 2016, 12 pages.

Wikipedia, "Garbage Collection (Computer Science)," downloaded from https://en.wikipedia.org/wiki/Garbage_collection_(computer_science) on Jun. 8, 2016, 10 pages.

International Preliminary Report on Patentability for Application No. PCT/US2017/035395, dated Jan. 10, 2019, 11 pages.

\* cited by examiner

FIG. 3

METHOD OF PERFORMING
BIT CHECK INSTRUCTION
350

RECEIVE BIT CHECK INSTRUCTION AT PROCESSOR, BIT CHECK INSTRUCTION INDICATING FIRST SOURCE OPERAND THAT INCLUDES FIRST BIT, AND INDICATING CHECK BIT VALUE FOR FIRST BIT — 351

COMPARE FIRST BIT WITH CHECK BIT VALUE IN RESPONSE TO BIT CHECK INSTRUCTION — 352

UPDATE CONDITION CODE BIT TO INDICATE WHETHER FIRST BIT EQUALS OR DOES NOT EQUAL CHECK BIT VALUE IN RESPONSE TO BIT CHECK INSTRUCTION — 353

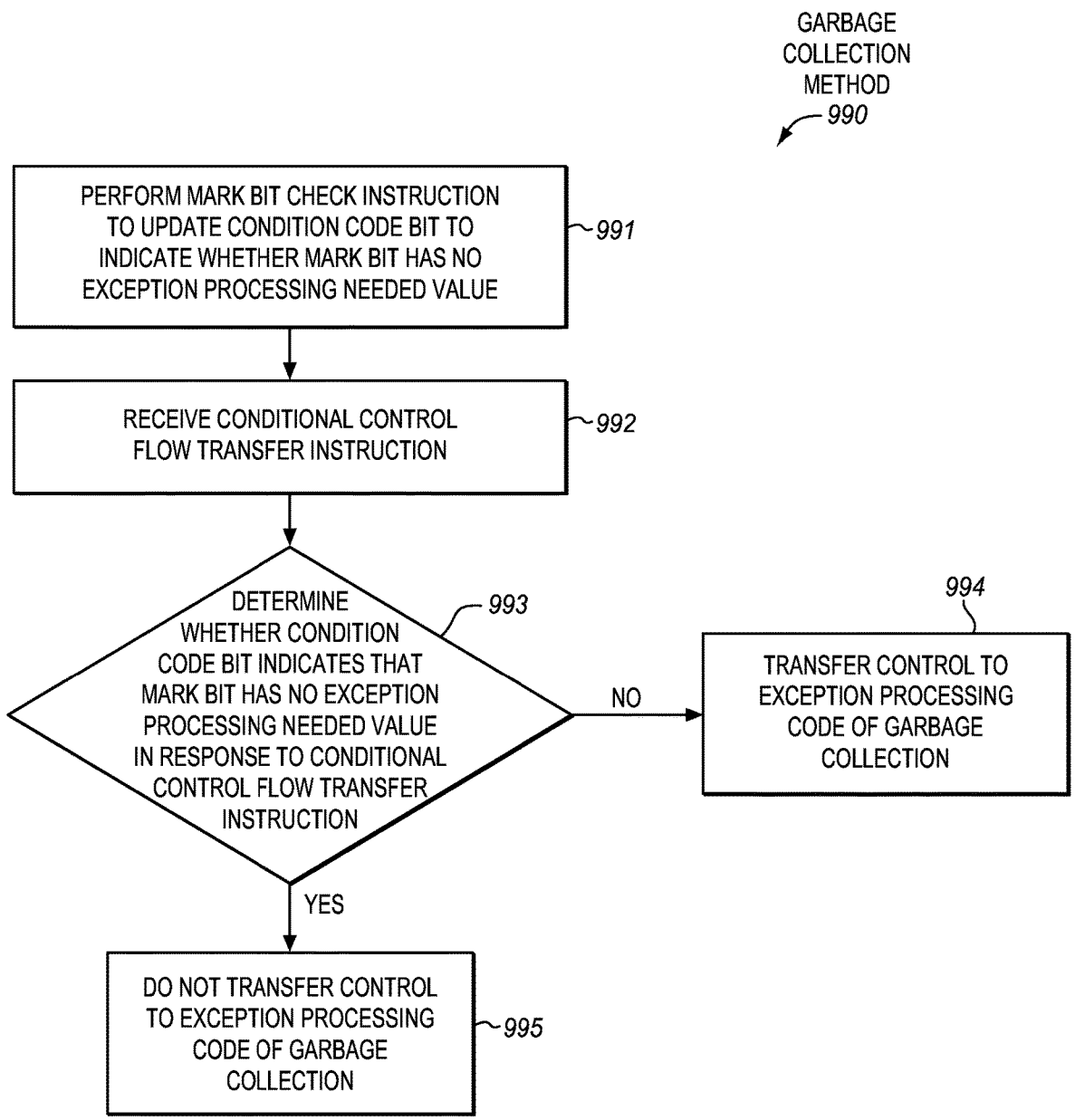

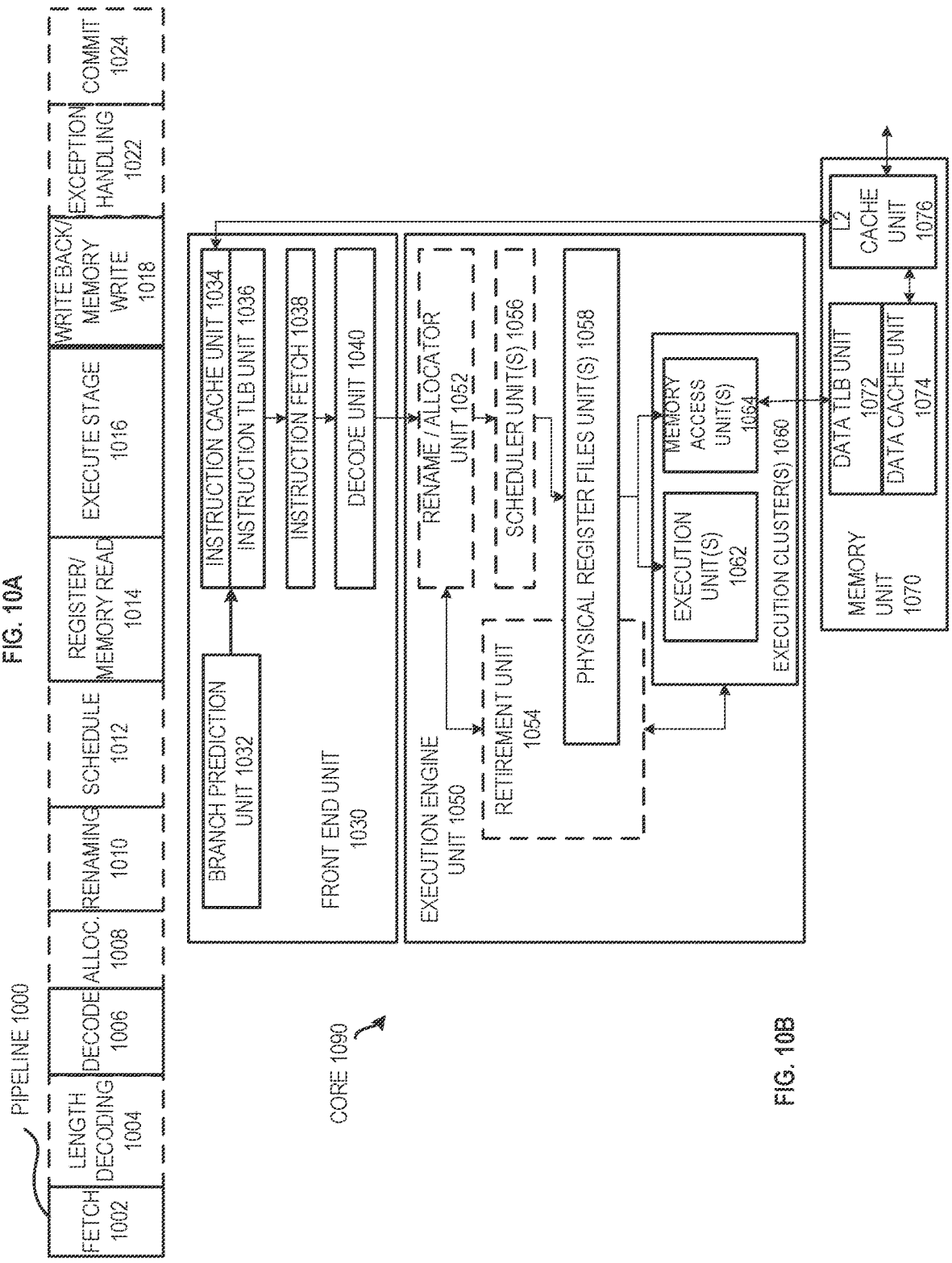

BIT CHECK PROCESSORS, METHODS, SYSTEMS, AND INSTRUCTIONS TO CHECK A BIT WITH AN INDICATED CHECK BIT VALUE

BACKGROUND

Technical Field

Embodiments described herein generally relate to processors. In particular, embodiments described herein generally relate to checking of bits with processors.

Background Information

Garbage collection (GC) is a type of automatic memory management that is commonly used in computer systems, which provides an alternative to manual memory management. By way of example, garbage collection may be used in Java, C#, Go, Microsoft .NET Framework, and various other environments. Garbage collection generally represents a process or algorithm that is used to inspect objects (e.g., portions of software and/or data), for example, those stored on a heap, in order to determine which of them are still being used, and which of them are no longer being used. The objects that are still being used generally represent referenced objects that are still being referenced (e.g., pointed to by a pointer) by an active program. Such objects still being used are also sometimes referred to in the arts as live objects. Conversely, the objects that are no longer being used may represent unreferenced objects that are no longer being referenced (e.g., are not being pointed to by any pointers) by any active programs. The unused objects are also sometimes referred to in the arts as dead objects or garbage. Commonly, in garbage collection such unused objects may be deleted, and the memory that was used for them may be freed or reclaimed.

BRIEF DESCRIPTION OF THE DRAWINGS

The invention may best be understood by referring to the following description and accompanying drawings that are used to illustrate embodiments. In the drawings:

FIG. 3 is a block flow diagram of an embodiment of a method of performing an embodiment of a bit check instruction.

FIG. 9 is a block flow diagram of an example embodiment of a garbage collection method that may use an embodiment of a bit check instruction.

FIG. 10A is a block diagram illustrating an embodiment of an in-order pipeline and an embodiment of a register renaming out-of-order issue/execution pipeline.

FIG. 10B is a block diagram of an embodiment of processor core including a front end unit coupled to an execution engine unit and both coupled to a memory unit.

DETAILED DESCRIPTION OF EMBODIMENTS

Disclosed herein are embodiments of bit check instructions, embodiments of processors to perform the instructions, embodiments of methods performed by the processors when performing the instructions, embodiments of systems incorporating one or more processors to perform the instructions, and embodiments of programs or machine-readable mediums providing the instructions. In some embodiments, the processors may have a decode unit or other logic to receive and/or decode the bit check instruction, and an execution unit or other logic to perform the bit check instruction. In the following description, numerous specific details are set forth (e.g., specific instruction operations, data formats, processor configurations, microarchitectural details, sequences of operations, etc.). However, embodiments may be practiced without these specific details. In other instances, well-known circuits, structures and techniques have not been shown in detail to avoid obscuring the understanding of the description.

Figure 1:
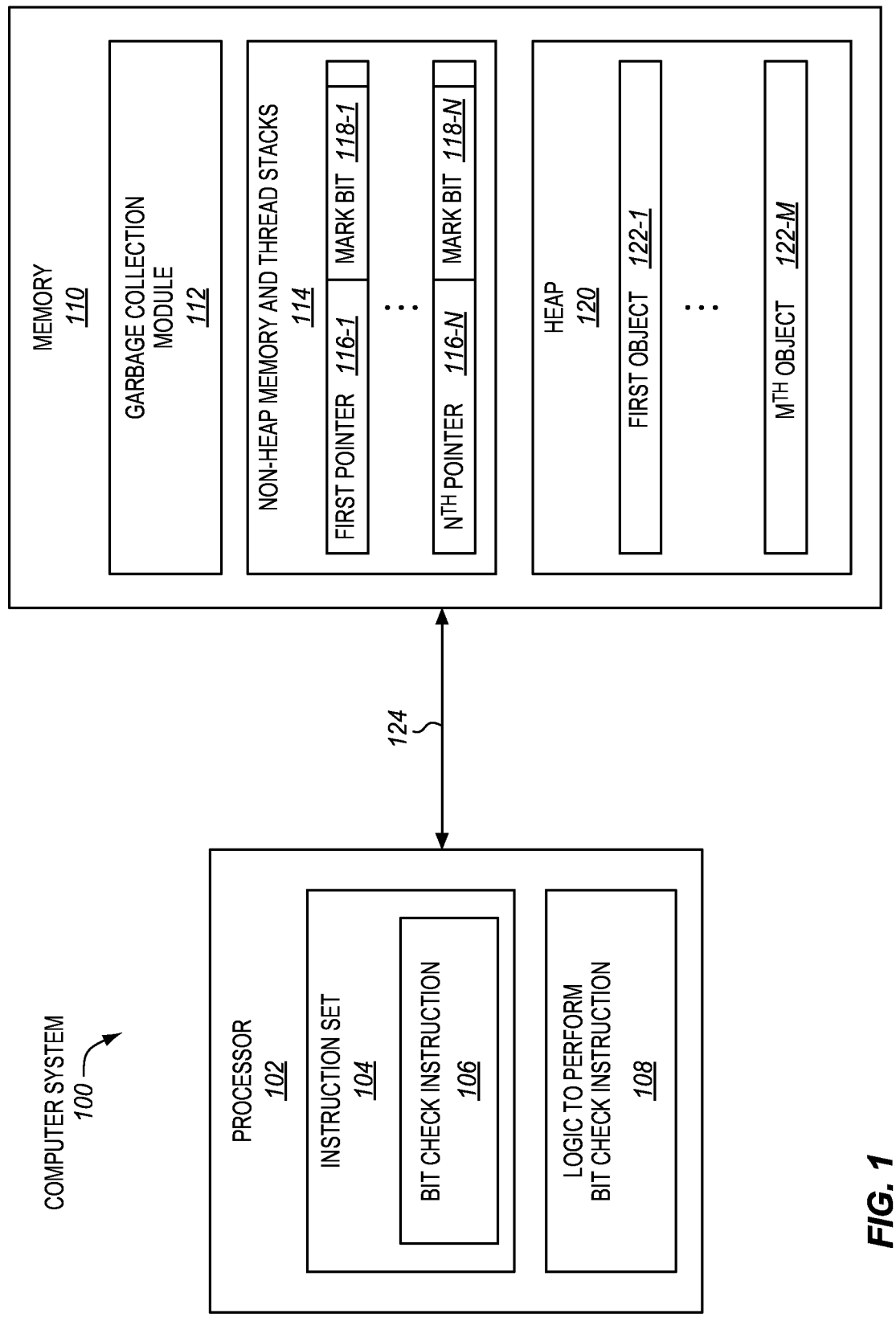
FIG. 1 is a block diagram of an embodiment of a computer system in which embodiments of the invention may be implemented.

FIG. 1 is a block diagram of an embodiment of a computer system 100 in which embodiments of the invention may be implemented. In various embodiments, the computer system may represent a desktop computer, a laptop computer, a notebook computer, a tablet computer, a netbook, a smartphone, a cellular phone, a server, a network device (e.g., a router, switch, etc.), a media player, a smart television, a nettop, a set-top box, a video game controller, or other type of electronic device. The computer system includes a processor 102 and a memory 110. The processor and the memory are coupled with one another, or otherwise in communication with one another, by a conventional coupling mechanism 124 (e.g., through one or more buses, hubs, memory controllers, chipset components, or the like).

The processor has an instruction set 104. The instructions of the instruction set represent macroinstructions, machine language instructions, instructions provided to the processor for execution, or instructions that a decoder of the processor is able to decode, as opposed to microinstructions, micro-ops, or other decoded instructions that result from the decoder decoding the instructions of the instruction set. In some embodiments, the instruction set may include at least one bit check instruction 106. The processor may also include logic 108 that is operative to perform the bit check instruction to check one or more bits in an operand. This logic may include hardware, firmware, software, or a combination thereof. In some embodiments, the logic may include at least some on-die logic located on a semiconductor die. In some embodiments, the logic may include at least some on-die transistors, circuitry, or other hardware.

Various different embodiments of the at least one bit check instruction 106 are disclosed herein. Some embodiments of the bit check instruction may be used in conjunction with garbage collection, although the scope of the invention is not so limited. Other embodiments of the bit check instruction may be used for other purposes and/or for other algorithms where it is desirable to check one or more bits. In order to illustrate certain concepts, the description that follows will often describe the use of the bit check instruction in conjunction with garbage collection, although the scope of the invention is not so limited.

Referring again to FIG. 1, the memory includes a garbage collection module 112. The garbage collection module may be operative to perform a garbage collection algorithm. Various different types of garbage collection algorithms are suitable. Examples of suitable garbage collection algorithms include, but not limited to, tracing garbage collection algorithms, concurrent runtime garbage collection algorithms, garbage collection algorithms that are able to relocate still in use objects from a current page to another page before deleting the current page, garbage collection algorithms that are able to compact non-contiguous or dispersed still in use objects remaining on a page after deleting unused objects, generational garbage collection algorithms, and various other forms of garbage collection algorithms, including new forms of garbage collection algorithms not yet developed, but which may also benefit from the embodiments described herein.

In some embodiments, a given bit may be utilized in conjunction with the garbage collection algorithm (e.g., as part of the garbage collection algorithm, or as a related algorithm used alongside the garbage collection algorithm). This bit is sometimes referred to in the arts as a mark-through bit (MTB) or as a not-marked through bit (NMTB). As used herein, this bit may be referred to simply as a mark bit, and it may be regarded broadly as a bit that has a bit value that is used to convey information that is useful in garbage collection. By way of example, non-heap memory and thread stacks 114 may have memory pointers 116 that point to or reference objects 122 on a heap 120. For example, there may be a first pointer 116-1 through an Nth pointer 116-N (e.g., usually a reasonably large number) that reference various ones of a first object 122-1 through an Mth object 122-M (e.g., usually a reasonably large number). Each of the pointers has a mark bit 118. For example, the first pointer has a first mark bit 118-1 and the Nth pointer has an Nth mark bit 118-N. The objects in the heap may also have pointers (not shown) which may have mark bits (not shown). For non-heap memory and thread stacks, the live objects are generally known. For the heap memory 120, garbage collection is generally used to identify the live objects (e.g., to collect them and defragment memory).

Initially, at the start of a phase of garbage collection, all of the pointers 116 may be traversed and all their mark bits 118 may be cleared to binary zero (as one example). Accordingly, when the new phase begins, all of the mark bits may have the same state or binary value. As one possible convention, this state may be used to indicate that the pointers have not yet been processed for garbage collection. In garbage collection, every pointer that references the heap may be processed to find the objects that are still in use in the heap and to collect or copy such objects. In addition, objects in the heap can also have pointers that point to other objects. So all these pointers initially in the non-heap memory and thread stacks and then in the heap may be traversed. For a pointer with a mark bit, that mark bit is used to signal unprocessed pointers for new phases of garbage collection. Software (e.g., threads) that read the pointer may check the mark bit in order to determine whether or not exception processing should be performed. Such a check may be performed after every read of a heap pointer for an implementation of concurrent garbage collection that uses mark bits. The check and the exceptional processing may implement a "load barrier" in the Java runtime system. There may be a large number of such pointers with such mark bits to check throughout the course of garbage collection. As a result, such checking of the mark bit may tend to contribute significantly to the overhead associated with performing garbage collection, and if not done efficiently may tend to reduce the performance of other applications. Accordingly, the approaches disclosed herein, which may help to accelerate or improve such a check, may tend to offer advantages.

One possible approach to check the mark bits is to use a sequence of instructions. For example, the following five line sequence of x86 code sequence could potentially be used to check the mark bit:

MOV R1,(R0); move pointer from register R0 to register R1

MOV R2,#1<<shift; move a mask having only one bit set in mark bit position to register R2

AND R2,R1; isolate mark bit in R2 by logical AND of pointer in R1 and mask in R2

XOR R2,R3; logical XOR NEPN value in R3 with mark bit in R2, and update zero flag JNE except_proc; jump if zero flag is zero (mark bit-≠NEPN value) to exception processing In this code, NEPN stands for no exception processing needed and refers to the value of the mark bit that does not need to make the jump to the exception processing, which is instead used for the opposite value of the mark bit.

An alternative approach is to use an embodiment of the bit check instruction 106 and the logic 108. In various embodiments, the bit check instruction may effectively consolidate operations similar to those of two or more of the instructions of the code sequence above (e.g., the second to fourth instructions, the first through fourth instructions, all five instructions, etc.) into a single instruction. Advantageously, this instruction may help to accelerate or improve the efficiency of checking the mark bit, although the scope of the invention is not so limited.

Recall from above that initially, at the start of a phase of garbage collection, all of the mark bits 118 may have the same state or binary value. This value may be the opposite of the no exception processing needed value. After the check of the mark bit for a given pointer, if the check of the mark bit reveals that the mark bit still has the initial state (e.g., cleared to binary zero in this example to indicate that exception processing is needed), then it may be determined that exception processing should be performed. By way of example, this may involve transferring to a different code (e.g., an exception processing submodule (e.g., except_proc in the code above) of the garbage collection module 112). Upon performing the processing, the state or bit value of the mark bit may be flipped or toggled atomically (e.g., in this example the bit value of the cleared bit may be set to binary one). Conversely, if the mark bit has the opposite state (e.g., the no exception processing needed value which is binary one in this example) as opposed to the initial state, then no exception processing may be needed. In such a case, there may be no need to transfer to the exception processing submodule of the garbage collection module. For each pointer, there may generally only be a single check of its corresponding mark bit per garbage collection phase. Before the phase completes, the state of all of the mark bits in the executable image should have been flipped to the new state (e.g., in this example set to binary one).

During the next phase, instead of traversing all the pointers 116 again, which all currently should have the mark bits 118 in the updated state (e.g., in this example set to binary one), and re-clear all the mark bits again, the meaning of the mark bit may instead be toggled or flipped. For example, in this next phase, instead of binary zero being used to indicate that the pointers have not yet been processed, binary one may instead be used to indicate that the pointers have not yet been processed. This toggling of the meaning may help to avoid an additional unneeded operation to traverse all the pointers again and re-clear all the mark bits, which can amount to a significant amount of processing. However, this may also toggle or change the operation of checking the mark bit. For example, instead of checking if the mark bits have a value of binary one as in the first phase, in the second phase the check may instead determine if the mark bits have a value of binary zero (for this particular example).

In some embodiments, the bit check instruction 106 may support such toggling or flipping of the bit check operation (e.g., by specifying or otherwise indicating a check bit value, as will be described further below). Advantageously, the bit check instruction 106, and the logic 108 used to perform it, may help to accelerate or improve the efficiency of performing the check of the mark bit. Such checking of the mark bit tends to be a ubiquitous check used in garbage collection (e.g., concurrent runtime garbage collectors). As a result, the bit check instruction can help to improve the performance of garbage collection and/or help to reduce its performance impact on other applications. In addition, it is expected that there are, or at least could be, other algorithms aside from just those related to garbage collection and/or other instances, where it may be useful or beneficial to check a bit to see if it has either a first value (e.g., is set) or a second value (e.g., is cleared). The bit check instruction 106 may also be used for such algorithms or such instances.

Figure 2:
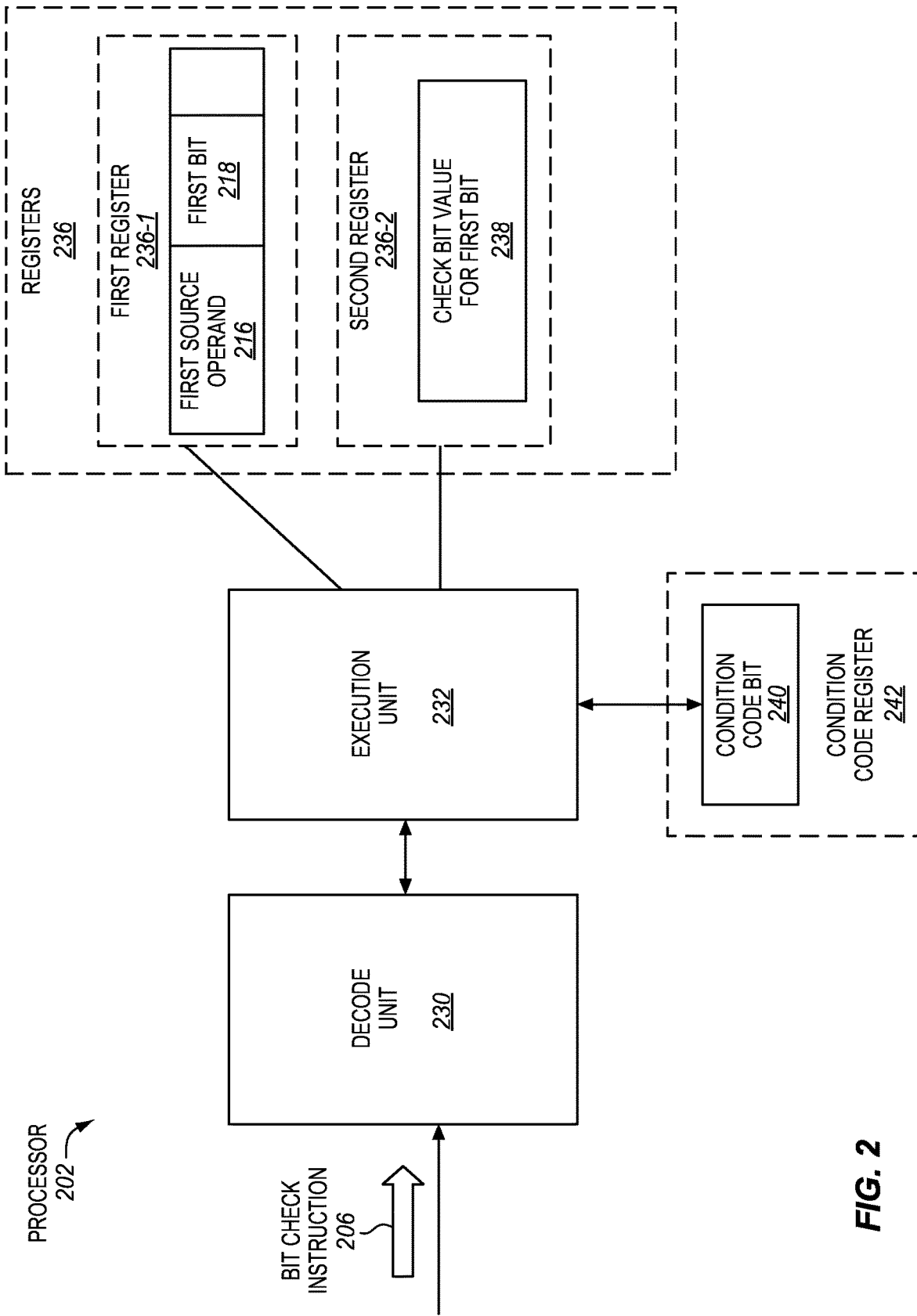
FIG. 2 is a block diagram of an embodiment of a processor that is operative to perform an embodiment of a bit check instruction.

FIG. 2 is a block diagram of an embodiment of a processor 202 that is operative to perform an embodiment of a bit check instruction 206. In some embodiments, the processor may be a general-purpose processor (e.g., a general-purpose microprocessor or central processing unit (CPU) of the type used in desktop, laptop, or other computers). Alternatively, the processor may be a special-purpose processor. Examples of suitable special-purpose processors include, but are not limited to, network processors, communications processors, cryptographic processors, graphics processors, co-processors, embedded processors, digital signal processors (DSPs), and controllers (e.g., microcontrollers). The processor may have any of various complex instruction set computing (CISC) architectures, reduced instruction set computing (RISC) architectures, very long instruction word (VLIW) architectures, hybrid architectures, other types of architectures, or have a combination of different architectures (e.g., different cores may have different architectures). In some embodiments, the processor may include be disposed on at least one integrated circuit or semiconductor die. In some embodiments, the processor may include at least some hardware (e.g., transistors, capacitors, diodes, circuitry, non-volatile memory storing microcode, or the like).

During operation, the processor 202 may receive the bit check instruction 206. For example, the instruction may be received from memory over a bus or other interconnect. The instruction may represent a macroinstruction, machine code instruction, or other instruction or control signal of an instruction set of the processor. In some embodiments, the bit check instruction may explicitly specify (e.g., through one or more fields or a set of bits that indicate a register having), or otherwise indicate (e.g., implicitly indicate a register having), a first source operand 216 that includes a first bit 218. In some embodiments, the first source operand may optionally be a memory pointer (e.g., a 32-bit or 64-bit offset into a heap memory used as a pointer), and the first bit may optionally be a mark bit to be used in conjunction with garbage collection, although the scope of the invention is no so limited.

In some embodiments, the bit check instruction may optionally specify or otherwise indicate a value to identify a bit position for the first bit as being any one of a plurality of different possible bit positions. This may optionally allow the instruction to be used to check different bits in different bit positions. Alternatively, in other embodiments, the bit check instruction may have an implicit fixed bit position for the first bit that is not explicitly specified. For example, the bit check instruction (e.g., an opcode thereof) may have an implicit fixed location for the first bit (e.g., which may correspond to the mark bit used in conjunction with garbage collection, or some other fixed bit position for some other algorithm).

In some embodiments, the bit check instruction may explicitly specify (e.g., through one or more fields or a set of bits that indicate a register having), or otherwise indicate (e.g., implicitly indicate a register having), a check bit value 238 for the first bit 218. The check bit value may represent a value to be checked or compared against the first bit. In some embodiments, the check bit value may be allowed to be either binary one or binary zero. As one example, one instance of the bit check instruction may indicate the check bit value to be binary one, and another instance of the same bit check instruction (e.g., the same opcode) may indicate the check bit value to be binary zero. Alternatively, different opcodes may optionally be provided for different values of the check bit value, if desired.

In some cases, the bit check instruction may have one or more source operand specification fields to specify registers, memory locations, or other storage locations that are used to store or identify the operands. As shown in the illustrated example, the first source operand 216 may optionally be stored in a first register 236-1 of a set of registers 236 (e.g., general-purpose registers), and the check bit value 238 may optionally be stored in a second register 236-1 of the set of registers. As one specific example, the bit check instruction may have a first field to specify the first register having the first source operand (e.g., a memory pointer), and a second field to specify the second register having the check bit value. Alternatively, one or more of these register operands may optionally be implicit to the instruction (e.g., a register may be implicit to an opcode of the instruction). As one specific example, the bit check instruction may implicitly indicate (e.g., without explicitly specifying) the first register having the first source operand, and may implicitly indicate (e.g., without explicitly specifying) the second register having the check bit value. Alternatively, the same register may optionally be used for both the first source operand and the check bit value. Moreover, memory locations or other storage locations may optionally be used for one or more of them. Also, the check bit value may optionally be provided directly within the encoding of the instruction (e.g., as a bit in a field, an immediate, as part of the opcode, etc.). Various combinations of such approaches are also suitable for the bit check instruction to indicate or otherwise provide the first source operand and the check bit value.

Each of the registers 236 may represent an on-die (or on integrated circuit) storage location that is operative to store data. The registers may represent architecturally-visible or architectural registers that are visible to software and/or a programmer and/or are the registers indicated by instructions of the instruction set of the processor to identify operands. These architectural registers are contrasted to other non-architectural registers in a given microarchitecture (e.g., temporary registers, reorder buffers, retirement registers, etc.). The registers may be implemented in different ways in different microarchitectures and are not limited to any particular type of design. Examples of suitable types of registers include, but are not limited to, dedicated physical registers, dynamically allocated physical registers using register renaming, and combinations thereof.

Referring again to FIG. 2, the processor includes a decode unit or decoder 230. The decode unit may receive and decode the bit check instruction 206. The instruction may have an opcode to identify the operation to be performed (e.g., a bit check operation). The decode unit may output one or more relatively lower-level instructions or control signals (e.g., one or more microinstructions, micro-operations, micro-code entry points, decoded instructions or control signals, etc.), which reflect, represent, and/or are derived from the relatively higher-level bit check instruction. In some embodiments, the decode unit may include one or more input structures (e.g., port(s), interconnect(s), an interface) to receive the bit check instruction, an instruction recognition and decode logic coupled therewith to recognize and decode the bit check instruction, and one or more output structures (e.g., port(s), interconnect(s), an interface) coupled therewith to output the lower-level instruction(s) or control signal(s). The decode unit may be implemented using various different mechanisms including, but not limited to, microcode read only memories (ROMs), look-up tables, hardware implementations, programmable logic arrays (PLAs), and other mechanisms suitable to implement decode units. In some embodiments, the decode unit may be included on a die (e.g., on die with the execution unit 232). In some embodiments, the decode unit may include at least some hardware (e.g., transistors, integrated circuitry, or on-die firmware, etc.).

In some embodiments, instead of the bit check instruction being provided directly to the decode unit, an instruction emulator, translator, morpher, interpreter, or other instruction conversion module may optionally be used. Various types of instruction conversion modules may be implemented in software, hardware, firmware, or a combination thereof. In some embodiments, the instruction conversion module may be located outside the processor, such as, for example, on a separate die and/or in a memory (e.g., as a static, dynamic, or runtime emulation module). By way of example, the instruction conversion module may receive the bit check instruction, which may be of a first instruction set, and may emulate, translate, morph, interpret, or otherwise convert the bit check instruction into one or more corresponding intermediate instructions or control signals, which may be of a second different instruction set. The one or more intermediate instructions or control signals of the second instruction set may be provided to a decode unit (e.g., decode unit 230), which may decode them into one or more lower-level instructions or control signals executable by native hardware of the processor (e.g., one or more execution units).

Referring again to FIG. 2, the execution unit 232 is coupled with the decode unit 230. In some embodiments, the execution unit may be on a die or integrated circuit (e.g., on die or integrated circuit with the decode unit). The execution unit may receive the one or more decoded or otherwise converted instructions or control signals that represent and/or are derived from the bit check instruction. The execution unit may also be coupled with or otherwise operative to receive the first source operand 216 and the check bit value 238 (e.g., may be coupled with the registers 236 if the first source operand and the check bit value are stored therein). The execution unit may be operative, in response to and/or as a result of the bit check instruction (e.g., in response to one or more instructions or control signals decoded therefrom and/or in response to the instruction being provided to a decoder), to compare the first bit with the check bit value, and to update a condition code bit 240 to indicate whether the first bit equals, or does not equal, the check bit value. By way of example, the comparison may optionally be performed by an exclusive-OR (XOR) operation. The XOR operation on the two bits may generate or produce a bit that is set to binary one if the bits are different (e.g., if one of the bits is one and the other is zero), or that is cleared to binary zero if the bits are the same (e.g., either both of the bits are one or both of the bits are zero). Alternatively, other logical operations, or combinations of logical operations, may optionally be used to perform the comparison. As shown, in some embodiments, the condition code bit may optionally be stored in a condition code register 242 along with potentially one or more other condition code bits.

Examples of suitable condition code bits for the condition code bit 240 include, but are not limited to, flags, status flags, status bits, condition codes, bits in a condition register, bits in a flag register, bits in a status register, and the like. In one embodiment, the condition code bit may be a zero flag or other zero condition code bit, although the scope of the invention is not so limited. As one specific example, the zero condition code bit may be set if the first bit equals the check bit value, and cleared if the first bit does not equal the check bit value. Without limitation, one or more other instructions may check the condition code bit, and proceed according to the value of the condition code bit. For example, in the case of a mark bit used in conjunction with garbage collection, a conditional control flow transfer instruction (e.g., the JNE instruction shown in the code sequence above) may check the condition code bit indicating whether the mark bit equals a no exception processing needed (NEPN) value, and may transfer control to an exception processing code if the condition code bit has a value that indicates that mark bit does not equal the NEPN value, or not transfer control to the exception processing module if the condition code bit has a value that indicates that the mark bit equals the NEPN value.

The execution unit and/or the processor may include specific or particular logic (e.g., transistors, integrated circuitry, or other hardware potentially combined with firmware (e.g., instructions stored in non-volatile memory) and/or software) that is operative to perform the bit check instruction and/or store the result in response to and/or as a result of the bit check instruction (e.g., in response to one or more instructions or control signals decoded from the bit check instruction). By way of example, the execution unit may include an arithmetic unit, an arithmetic logic unit, or a digital circuit to perform arithmetic and logical operations, or the like. In some embodiments, the execution unit may include one or more input structures (e.g., port(s), interconnect(s), an interface) to receive source operands, circuitry or logic coupled therewith to receive and process the source operands, and one or more output structures (e.g., port(s), interconnect(s), an interface) coupled therewith to provide a value or other signal to update the value of the condition code bit. In some embodiments, the execution unit may include the circuitry or logic shown and described further below for FIG. 7, although the scope of the invention is not so limited.

To avoid obscuring the description, a relatively simple processor 202 has been shown and described. However, the processor may optionally include other processor components. For example, various different embodiments may include various different combinations and configurations of the components shown and described for any of FIGS. 10-12. All of the components of the processor may be coupled together to allow them to operate as intended. By way of example, considering FIG. 10B, the instruction cache 1034 may cache the instructions, the instruction fetch unit 1038 may fetch the instruction, the decode unit 1040 may decode the instruction, the scheduler unit 1056 may schedule the associated operations, the execution unit 1062 may perform the instruction, the retirement unit 1054 may retire the instruction, etc.

FIG. 3 is a block flow diagram of an embodiment of a method 350 of performing an embodiment of a bit check instruction. In various embodiments, the method may be performed by a processor, instruction processing apparatus, digital logic device, or integrated circuit. In some embodiments, the method 350 may be performed by and/or with the processor 202 and/or using the bit check instruction 206 of FIG. 2. The components, features, and specific optional details described herein for the processor 202 and/or the instruction 206 also optionally apply to the method 350. Alternatively, the method 350 may be performed by and/or within a similar or different processor or apparatus and/or using a similar or different instruction. Moreover, the processor 202 may perform methods the same as, similar to, or different than the method 350.

The method includes receiving the bit check instruction, at block 351. In various aspects, the instruction may be received at a processor or a portion thereof (e.g., an instruction fetch unit, a decode unit, a bus interface unit, etc.). In various aspects, the instruction may be received from an off-processor and/or off-die source (e.g., from memory, interconnect, etc.), or from an on-processor and/or on-die source (e.g., from an instruction cache, instruction queue, etc.).

The bit check instruction may specify or otherwise indicate a first source operand that includes a first bit, and may specify or otherwise indicate a check bit value for the first bit. In some embodiments, the first source operand may optionally be a memory pointer (e.g., a 32-bit or 64-bit offset into a heap memory used as a pointer), and the first bit may optionally be a mark bit to be used in conjunction with garbage collection, although the scope of the invention is no so limited. In some embodiments, the check bit value may be allowed (e.g., by the instruction) to be either binary one or binary zero. Alternatively, different instructions may optionally be used for binary one and binary zero. The first source operand and the check bit value may be indicated in various different ways, as described above.

At block 352, the first bit may be compared with the check bit value, in response to the bit check instruction. In some embodiments, the bits may be compared for equality. As one specific example, an XOR operation may be performed to compare the bits. Alternatively, other logical operations, or combinations of logical operations, may optionally be used to compare the bits.

At block 353, a condition code bit may be updated to indicate whether the first bit equals or does not equal the check bit value, in response to the bit check instruction. In one embodiment, the condition code bit may be a zero flag or other zero condition code bit, although the scope of the invention is not so limited. As one specific example, the zero condition code bit may be set if the first bit equals the check bit value, and cleared if the first bit does not equal the check bit value.

The illustrated method involves architectural operations (e.g., those visible from a software perspective). In other embodiments, the method may optionally include one or more microarchitectural operations. By way of example, the instruction may be fetched, decoded, scheduled out-of-order, source operands may be accessed, an execution unit may perform microarchitectural operations to implement the instruction, etc. In some embodiments, the microarchitectural operations to implement the instruction may optionally include any of those shown and described in conjunction with FIG. 6 and/or FIG. 7.

Figure 4:
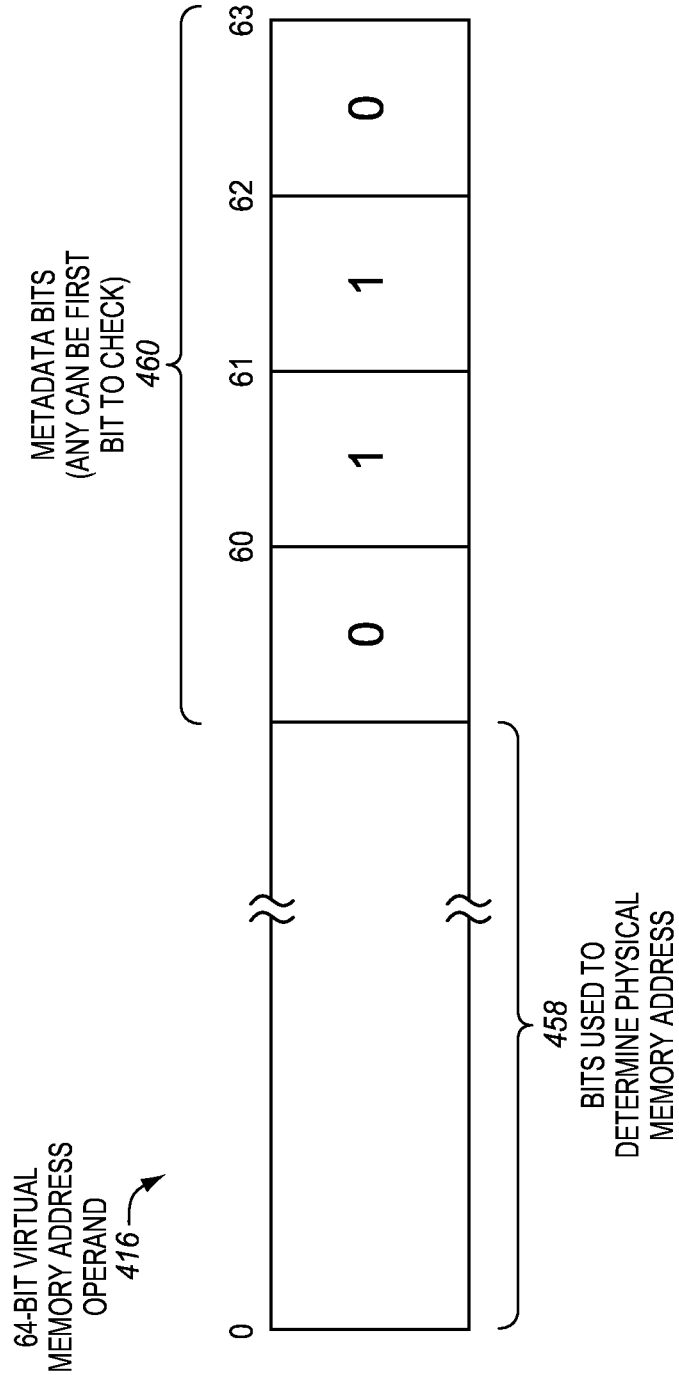
FIG. 4 is a block diagram of an example embodiment of a 64-bit virtual memory address operand that is suitable for a source operand of a bit check instruction.

FIG. 4 is a block diagram of an example embodiment of a 64-bit virtual memory address operand 416 that is suitable for a source operand of a bit check instruction. For example, the operand 416 may be used as the first source operand 216 discussed above for FIG. 2. The 64-bit virtual memory address operand includes a set of least significant bits 458 that may be used to determine a physical memory address. For example, these bits 458 may represent a virtual memory address that may be converted (e.g., during an address translation process) to a corresponding physical memory address, which may be used to access a location in physical memory.

The 64-bit virtual memory address operand also includes a set of most significant metadata bits 460, which are not used to identify the physical memory address (e.g., are not used during the address translation process). 64-bits are able to address a vast address space. In many cases, such a vast address space is not needed. In such cases, only a subset of the 64-bits, which is commonly a least significant subset of bits, may be used to address a smaller address space. A remaining subset of the 64-bits, which is commonly a most significant subset, may be borrowed or used for other purposes. In the illustrated example, four most significant bits [63:60] are used for such metadata bits 460, although other numbers may optionally be used in other embodiments.

The metadata bits 460 may commonly be used to provide additional data or information associated in some way with the 64-bit virtual memory address operand. As one specific example, one of the bits may optionally be used as a mark bit that is to be used in conjunction with garbage collection and that is to be used to convey information about whether or not the 64-bit virtual memory address operand has already been processed for garbage collection (or more generally information relevant to garbage collection and/or information to support garbage collection), although the scope of the invention is no so limited. In other embodiments, one or more of the bits may optionally be used to provide information or data associated with the pointer for purposes of some other process or algorithm (e.g., a page table related algorithm, an address translation related algorithm, how a virtual memory address is used in an application, the like).

In other cases, least significant bits may be used as metadata bits. For example, a heap object is aligned on multiple bytes (e.g., 2, 4, or 8), low-order bits may be available to be metadata bits if the addressing logic uses a value of binary zero for those bits. For example, if the heap object starts on an 8-byte aligned boundary, three least significant bits could potentially be used as metadata bits. The approach described above may also apply to such low order metadata bits.

Figure 5:
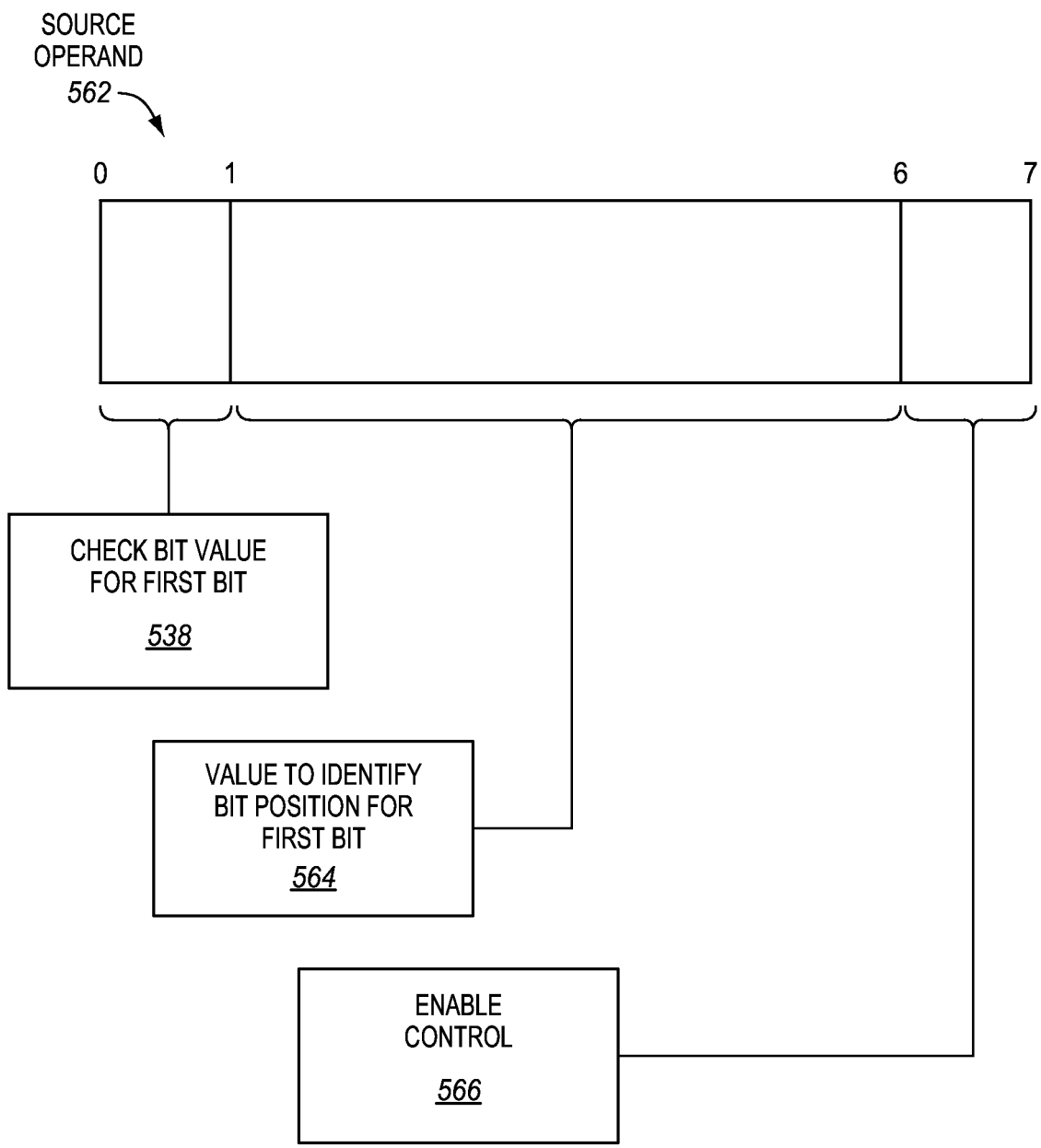
FIG. 5 is a block diagram of an example embodiment of a suitable source operand for a bit check instruction.

FIG. 5 is a block diagram of an example embodiment of a suitable source operand 562 for a bit check instruction. For example, the operand 562 may be used to convey the check bit value 238 as discussed above for FIG. 2. In the illustrated example embodiment, the source operand 562 is an 8-bit operand, although in other embodiments fewer or more bits may optionally be used. In some embodiments, the source operand may optionally be stored in a register (e.g., a general-purpose register) or other storage location, which may be indicated by the bit check instruction. In other embodiments, the source operand may optionally be an immediate of the bit check instruction.

In the illustrated example embodiment, the source operand includes a check bit value 538 for the first bit. The check bit value may represent a single bit binary value against which a corresponding bit is to be checked or compared during the performance of the bit check instruction. As shown, the check bit value may be stored in a single bit position of the source operand. In the illustrated example, this bit position is the least significant bit position or bit-0, although various other bit positions may be used in other embodiments. The check bit value may be allowed to have different single bit binary values (e.g., allow either binary zero or binary one). By allowing both binary values, software may choose which value is to be used, which may allow the bit check to compare for equality with a given bit that has either a value of binary one or a value of binary zero. By way of example, this flexibility may be useful and beneficial in certain algorithms, such as, for example, garbage collection, where a meaning of a bit may toggle or change at different points in time. In some embodiments, the check bit value may be used to represent the active or no processing required state of the mark bit in garbage collection, although the scope of the invention is not so limited.

Referring again to FIG. 5, in the illustrated example embodiment, the source operand also optionally includes a value 564 to identify a bit position for the first bit. By way of example, the value may be used to identify a bit position of one of the metadata bits 460 of FIG. 4, although the scope of the invention is not so limited. As shown in the illustrated example, the value may optionally be stored in six bits, although fewer or more bits may alternatively optionally be used. In the specific illustrated example, bits [6:1] are used, although various other bit positions may optionally be used in other embodiments. It is often convenient, but is not required, that a contiguous group of bits be used. Including such a value may allow the same bit check instruction to be used to check different bits in different bit positions by changing the value used to identify those different bit position. However, including this value is optional, not required. For example, in other embodiments, a bit position to be used by the bit check instruction may optionally be fixed or implicit to the bit check instruction (e.g., to its opcode).

Referring again to FIG. 5, in the illustrated example embodiment, the source operand also optionally includes a enable control 566. In some embodiments, the enable control, when configured in a particular way (e.g., not enabled or disabled), may be operative to cause performance of a bit check instruction to update a condition code bit in a same way (e.g., to a same value) regardless of the value of the bit being compared by the bit check instruction and/or regardless of the value of the check bit value. In some embodiments, the enable control, when configured in a particular way, may be operative to cause performance of a bit check instruction to update a condition code bit in a same way regardless of whether the bit being compared by the bit check instruction equals or does not equal the check bit value. That is, in such a case, the performance of the bit check instruction may cause a same architectural event or action, regardless of the outcome of the comparison and/or regardless of the inputs to the comparison. By way of example, in one embodiment, the enable control, when configured in a particular way, may be operative to cause performance of a bit check instruction to set a zero flag or other zero condition code bit to binary one regardless of the value of the bit being compared by the bit check instruction and/or regardless of the value of the check bit value. In contrast, in some embodiments, the enable control, when configured in a different way (e.g., the opposite way), may be operative to cause performance of a bit check instruction to update a condition code bit in a way that is dependent or based on the value of the bit being compared and the check bit value and/or in a way that is dependent or based on whether the bit being compared equals or does not equal the check bit value.

As shown in the illustrated example, the enable control may optionally be stored in a single bit, although fewer or more bits may alternatively optionally be used. In the specific illustrated example, bit-7 is used, although various other bit positions may optionally be used in other embodiments. As one illustrative example of possible use, the optional enable control may be used to allow non-application threads, such as garbage collection threads, to perform updates to the mark bits without causing application threads to react to the new states of the mark bits. However, including this value is optional, not required.

Figure 6:
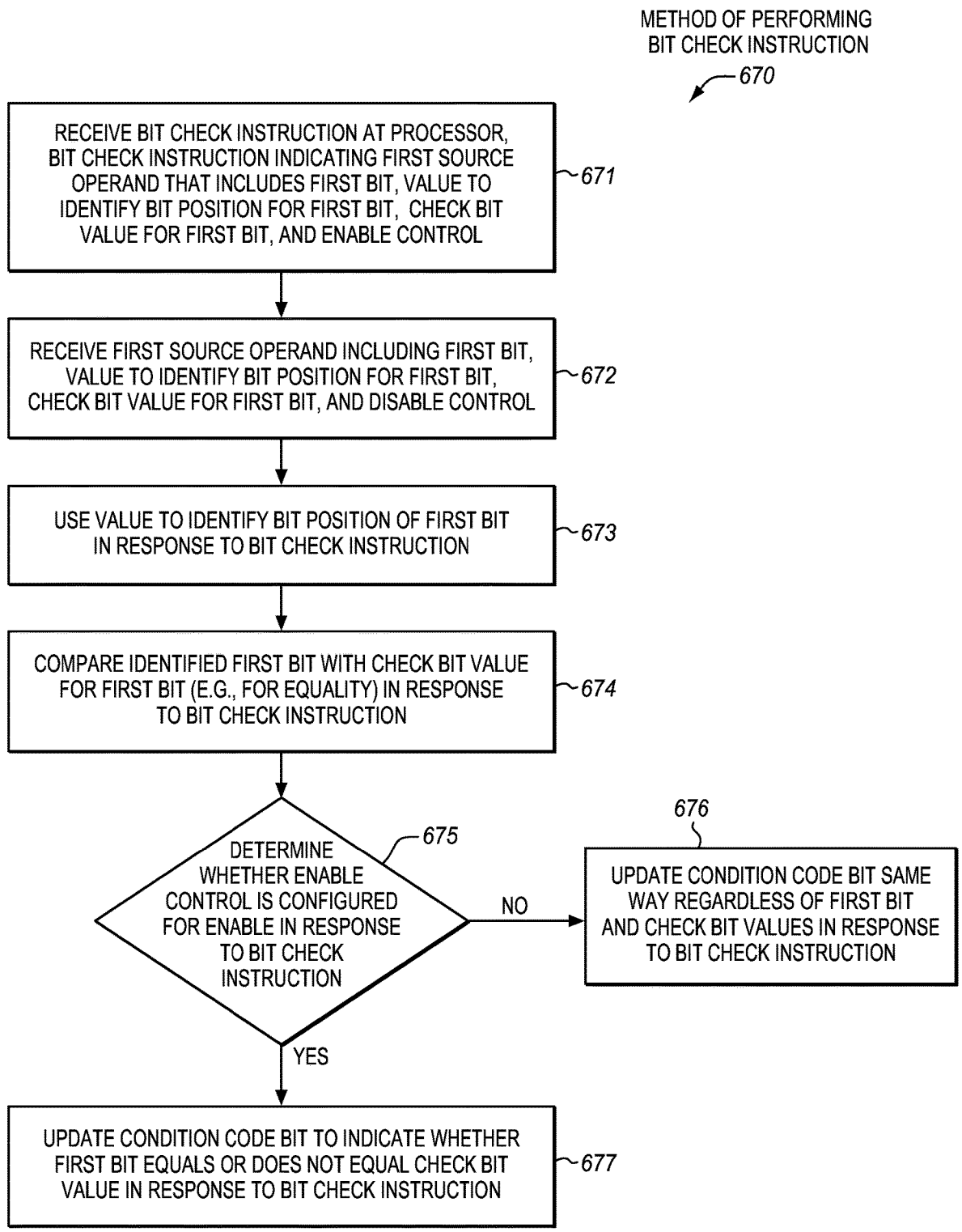
FIG. 6 is a block flow diagram of a detailed example embodiment of a method of performing a bit check instruction.
Figure 7:
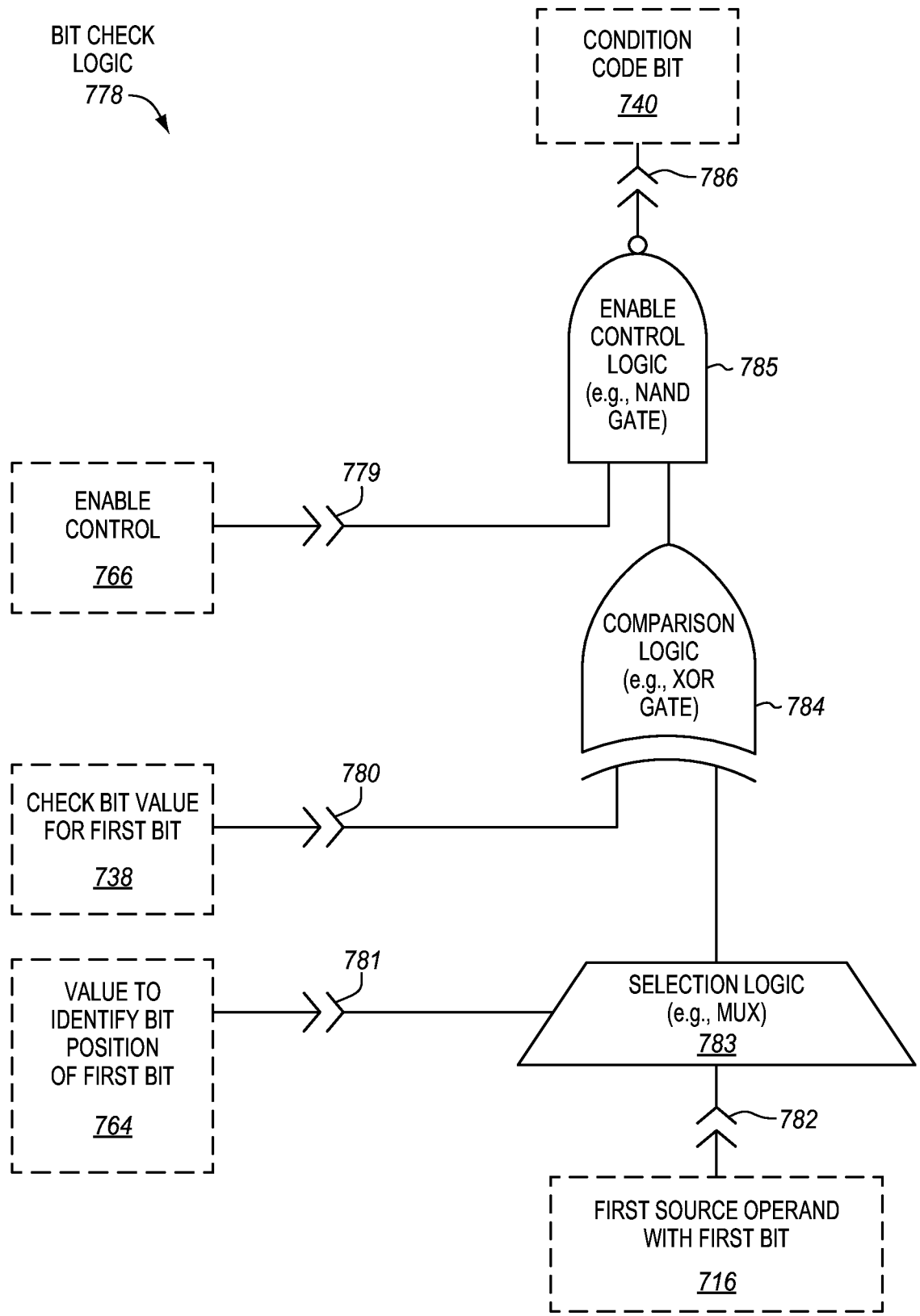
FIG. 7 is a block diagram illustrating an example embodiment of bit check logic that is operative to perform a bit check instruction.

FIG. 6 is a block flow diagram of a more detailed example embodiment of a method 670 of performing a bit check instruction. FIG. 7 is a block diagram illustrating an example embodiment of bit check logic 778 that is operative to perform a bit check instruction. To streamline the description, the method 670 will be described with reference to the logic 778. However, the method 670 may also optionally be performed with similar or different logic than the particular logic 778. Moreover, the logic 778 may be used to perform methods similar to or different than the particular method 670.

Referring to FIG. 6, a bit check instruction may be received at a processor, at block 671. In some embodiments, the bit check instruction may specify or otherwise indicate a first source operand that includes a first/given bit, may specify or otherwise indicate a value to identify a bit position for the first bit, may specify or otherwise indicate a check bit value for the first bit, and may specify or otherwise indicate an enable control. These may be provided in various different ways as described elsewhere herein. In one specific example embodiment, these may be provided by the source operand 562, although the scope of the invention is not so limited.

At block 672, the first source operand including the first bit, the value to identify the bit position for the first bit, the check bit value, and the enable control may be accessed or otherwise received (e.g., by an execution unit, by bit check logic, etc.). Referring now to FIG. 7, the bit check logic may be coupled or otherwise operative to receive as inputs a first source operand 716 with a first bit, a value 764 to identify a bit position of the first bit, a check bit value 738 for the first bit, and an enable control 766. For example, the bit check logic may have a first input 782 to receive as an input the first source operand, a second input 781 to receive as input the value 764, a third input 780 to receive as input the check bit value 738, and a fourth input 779 to receive as an input the enable control 766. Examples of suitable inputs include, but are not limited to, wires or other interconnects, ports, interfaces, etc.

Referring again to FIG. 6, the input value (i.e., which is to be used to identify the bit position for the first bit) may be used to identify a bit position of the first bit, in response to the bit check instruction, at block 673. As shown in FIG. 7, the bit check logic includes a selection logic 783. The selection logic is coupled or operative to receive as a first input the first source operand 716 with the first bit, and is coupled to receive as an input selection control the value 764. The selection logic is operative to select the first bit of the first source operand 716 as a single bit based on the input value 764. One example of suitable selection logic is a multiplexer (MUX). The selection logic may output the selected first bit to comparison logic 784.

Referring again to FIG. 6, the identified first bit may be compared with the provided check bit value for the first bit, in response to the bit check instruction, at block 674. In some embodiments, the comparison may be for equality. In other embodiments, the comparison may be for lack of equality. As shown in FIG. 7, the bit check logic includes comparison logic 784 that is operative to perform a comparison of the selected first bit and the check bit value 738. The comparison logic is coupled to receive as a first input the selected first bit from the selection logic 783, and is coupled to receive as a second input the check bit value. One example of suitable comparison logic is an XOR logic gate to perform an XOR operation. In some embodiments, the XOR operation may perform a bitwise XOR operation on the input first bit and the check bit value, and generate as an output a result bit that indicates the result of the comparison. The result or output bit may be set to binary one if the compared input bits are different, or may be cleared to binary zero if the compared input bits are the same. Alternatively, other types of logic gates, or combinations of two or more logic gates, may optionally be used to perform the comparison. The comparison logic may provide a result of the comparison (e.g., a bit value) as an output.

Referring again to FIG. 6, a determination may be made at block 675 whether or not the enable control is configured for enable in response to the bit check instruction. If the enable control is not configured for enable (e.g., "no" is the determination at block 675), then the method may advance to block 676. At block 676, when normal operation of the instruction is disabled, the condition code bit may be updated in a same way regardless of the values of the first bit and the check bit, in response to the bit check instruction.

Alternatively, if the enable control is configured for enable (e.g., "yes" is the determination at block 675), then the method may advance to block 677. At block 677, when normal operation of the instruction is enabled, the condition code bit may be updated to indicate whether the first bit equals or does not equal the check bit value in response to the bit check instruction. That is, the condition code bit may be updated differently dependent upon and/or for at least some different values of the first bit and the check bit.

As shown in FIG. 7, the bit check logic includes enable control logic 785. The enable control logic is coupled to receive as a first input the enable control 766, and is coupled to receive as a second input the result of the comparison from the comparison logic. By way of example, each of these inputs may represent a single bit value. An output of the dis enable able control logic is coupled with a condition code bit 740. One suitable example of a condition code bit is a zero flag or other zero condition code bit, although the scope of the invention is not so limited.

The enable control logic may be operative to be controlled by the enable control. In some embodiments, the enable control, when configured in a particular way (e.g., for disable, which in the illustrated example may be a value of binary zero), may be operative to cause the enable control logic to update the condition code bit in a same way (e.g., to a same value) regardless of the output of the comparison logic and/or regardless of the values of the first bit and the check bit and/or regardless of whether the first bit equals the check bit value. In contrast, in some embodiments, the enable control, when configured in a different way (e.g., for enable, which in the illustrated example may be a value of binary one), may be operative to cause the enable control logic to update the condition code bit in a way that is dependent or based on the output of the comparison logic and/or that is dependent or based on the values of the first bit and the check bit and/or that is dependent or based on whether the first bit equals the check bit value.

One suitable example embodiment of the enable control logic is a NOT-AND (NAND) logic gate. Also, one suitable example embodiment of the condition code bit is a zero flag or other zero condition code bit. In some embodiments, the enable control being cleared to binary zero may be operative to cause the NAND logic gate to always set the zero condition code bit to binary one regardless of the outcome of the comparison, whereas the enable control being set to binary one may be operative to cause the NAND logic gate to update the zero condition code bit based on the outcome of the comparison. For example, in some embodiments, in the latter case, the zero condition code bit may be updated to be the logical NOT of the result of the comparison. For example, in some embodiments, the zero condition code bit may be set if the first bit equals the check bit value.

Figure 8:
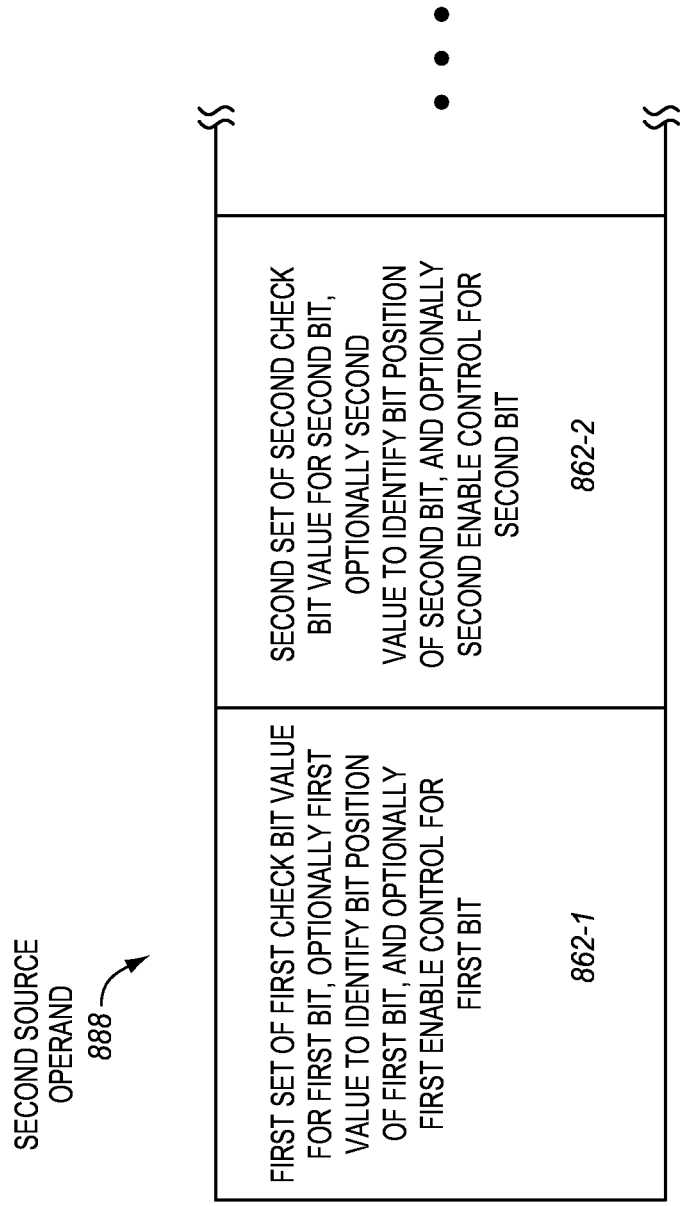
FIG. 8 is a block diagram of another example embodiment of a suitable source operand for a bit check instruction, which may be used to convey at least two check bit values for at least two different bits to be checked by the bit check instruction.

FIG. 8 is a block diagram of another example embodiment of a suitable source operand 888 for a bit check instruction, which may be used to convey at least two check bit values for at least two different bits to be checked by the bit check instruction. For example, the operand 888 may be used to convey the check bit value 238 as discussed above for FIG. 2, as one or more other check bit values to be used in the check of one or more other bits.

The operand includes a first set 862-1 of a first check bit value for a first bit, optionally a first value to identify a bit position of the first bit, and optionally a first enable control for the comparison pertaining to the first bit. In some embodiments, each of these may have the same characteristics and variations as described for the operand 562 of FIG.

5. In other embodiments, either or both of the first value and/or the first enable control may optionally be omitted.

The operand also includes at least a second set 862-2 of a second check bit value for a second bit, optionally a second value to identify a bit position of the second bit, and optionally a second enable control for the comparison pertaining to the second bit. In some embodiments, each of these may have the same characteristics and variations as described for the operand 562 of FIG. 5. In other embodiments, either or both of the second value and/or the second enable control may optionally be omitted.

In some embodiments, the operand may also optionally include additional such sets analogous to the first set 862-1 and the second set 862-2. By way of example, eight sets may each be included in a different corresponding byte of a 64-bit operand. As another example, four sets may each be included in a different corresponding byte of a 32-bit operand. Alternatively, provided an immediate is able to have a sufficient number of bits, the operand 888 may optionally be included in the immediate.

Advantageously, including two or more such sets 862-1, 862-2 may allow a bit check instruction to be used to perform bit check operations on two or more different bits in parallel and/or within the confines of the performance of the same bit check instruction. Each of the check bit values in the operand may correspond to a different bit in a source operand (e.g., a pointer). In some embodiments, an execution unit, in response to the bit check instruction, may be operative to compare each of the two or more check bit values with a different corresponding one of the two or more bits to be checked. In one aspect, only a subset of the bits in this source operand may be compared but not all of them. For example, only two or more of the metadata bits 460 may be compared by the bit check instruction but none of the bits 458.

In some embodiments, the execution unit may also update a different corresponding condition code bit based on the corresponding comparison. For example, the comparison for one bit may update a zero condition code bit, the comparison for another bit may update an overflow flag or other overflow condition code bit, or the like. In other embodiments, combinatorial logic may be performed on the different comparison results and a single bit (or least less bits than were tested) may be adjusted based on the result or output of the combinatorial logic.

FIG. 9 is a block flow diagram of an example embodiment of a garbage collection method 990 that may use an embodiment of a bit check instruction. In various embodiments, the method may be performed by a processor, instruction processing apparatus, digital logic device, or integrated circuit. In some embodiments, the method 990 may be performed by and/or with the processor 202 of FIG. 2 and/or using the bit check instruction 206 of FIG. 2. The components, features, and specific optional details described herein for the processor 202 and/or the instruction 206 also optionally apply to the method 990. Alternatively, the method 990 may be performed by and/or within a similar or different processor or apparatus and/or using a similar or different instruction. Moreover, the processor 202 may perform methods the same as, similar to, or different than the method 990.

The method includes performing a mark bit check instruction to update a condition code bit to indicate whether the mark bit has a no exception processing needed value, at block 991. In some embodiments, this may include performing the method 350 described for FIG. 3, including the variations and alternatives mentioned therefor. In some embodiments, this may include performing the method 670 described for FIG. 6, including the variations and alternatives mentioned therefor.

At block 992, a conditional control flow transfer instruction may be received. Examples of suitable conditional control flow transfer instructions include, but are not limited to, conditional jump instructions, conditional branch instructions, and the like. One specific suitable example is a JNE (e.g., jump if not equal) instruction in certain Intel Architecture processors, although the scope of the invention is not so limited. Various other conditional jump instructions and conditional branch instructions are also suitable.

At block 993, a determination may be made whether the condition code bit, which was updated by the mark bit check instruction, indicates that the mark bit has a no exception processing needed (NEPN) value, in response to the conditional control flow transfer instruction. The conditional control flow transfer instruction may specify (e.g., explicitly specify) or otherwise indicate (e.g., implicitly indicate) the condition code bit. For example, the JNE instruction implicitly indicates the zero flag. In some embodiments, the JNE instruction may test the zero flag and conditionally jump if the zero flag is cleared to binary zero (e.g., indicating the mark bit does not have the NEPN value), or not jump if the zero flag is set to binary one (e.g., indicating the mark bit does have the NEPN value). This is just one possible convention. The opposite convention is also possible. Accordingly, the condition code bit used by the bit check instruction may be checked and processing may proceed based on the status of this bit.

If the condition code bit indicates that the mark bit does not have the NEPN value (i.e., "no" is the determination at block 993), the method may advance to block 994. At block 994, the control flow transfer may be performed and control may be transferred other code. In some embodiments, the control flow transfer may be to exception processing code of a garbage collection algorithm (or more generally to garbage collection code).

Alternatively, if the condition code bit indicates that the mark bit has the NEPN value (i.e., "yes" is the determination at block 993), the method may advance to block 995. At block 995, no control flow transfer to other code may be performed. Control flow may not transfer to exception processing code of a garbage collection algorithm or to other garbage collection code. Rather, execution may continue with the next sequential instruction.

In some embodiments, in order to help reduce the performance impact of such a check, downstream code may optionally not be dependent of any of the registered results. Also, in some embodiments, an instruction (e.g., a bit check instruction) may be operative to disable a dynamic branch prediction mechanism for a subsequent branch instruction and/or cause the branch to be statically predicted in a given way (e.g., predicted to be taken or not taken) for that subsequent branch instruction. This may be true even when there is an existing branch cache entry for the branch instruction (e.g., is not limited to static prediction when there is not a branch cache entry). Conventional dynamic branch predictors typically do not allow an instruction prior to a branch instruction or other conditional control flow transfer instruction to disable the dynamic branch prediction mechanism and instead rely on a static prediction, of either taken or not taken, for the branch. For example, a bit check instruction if used for garbage collection may cause or force the branch or other conditional control flow transfer instruction to be statically predicted by default as statically not taken in a way that overrides dynamic branch prediction. If the control flow transfer is taken, it is likely that a subroutine may be called to actually perform the garbage collection processing. However, if the bit check instruction disables such dynamic branch prediction for the following branch instruction, and predicts always no garbage collection processing, then the performance of that path may typically be consistently higher performing.

Exemplary Core Architectures, Processors, and Computer Architectures

Processor cores may be implemented in different ways, for different purposes, and in different processors. For instance, implementations of such cores may include: 1) a general purpose in-order core intended for general-purpose computing; 2) a high performance general purpose out-of-order core intended for general-purpose computing; 3) a special purpose core intended primarily for graphics and/or scientific (throughput) computing. Implementations of different processors may include: 1) a CPU including one or more general purpose in-order cores intended for general-purpose computing and/or one or more general purpose out-of-order cores intended for general-purpose computing; and 2) a coprocessor including one or more special purpose cores intended primarily for graphics and/or scientific (throughput). Such different processors lead to different computer system architectures, which may include: 1) the coprocessor on a separate chip from the CPU; 2) the coprocessor on a separate die in the same package as a CPU; 3) the coprocessor on the same die as a CPU (in which case, such a coprocessor is sometimes referred to as special purpose logic, such as integrated graphics and/or scientific (throughput) logic, or as special purpose cores); and 4) a system on a chip that may include on the same die the described CPU (sometimes referred to as the application core(s) or application processor(s)), the above described coprocessor, and additional functionality. Exemplary core architectures are described next, followed by descriptions of exemplary processors and computer architectures.

Exemplary Core Architectures

In-Order and Out-of-Order Core Block Diagram

FIG. 10A is a block diagram illustrating both an exemplary in-order pipeline and an exemplary register renaming, out-of-order issue/execution pipeline according to embodiments of the invention. FIG. 10B is a block diagram illustrating both an exemplary embodiment of an in-order architecture core and an exemplary register renaming, out-of-order issue/execution architecture core to be included in a processor according to embodiments of the invention. The solid lined boxes in FIGS. 10A-B illustrate the in-order pipeline and in-order core, while the optional addition of the dashed lined boxes illustrates the register renaming, out-of-order issue/execution pipeline and core. Given that the in-order aspect is a subset of the out-of-order aspect, the out-of-order aspect will be described.

In FIG. 10A, a processor pipeline 1000 includes a fetch stage 1002, a length decode stage 1004, a decode stage 1006, an allocation stage 1008, a renaming stage 1010, a scheduling (also known as a dispatch or issue) stage 1012, a register read/memory read stage 1014, an execute stage 1016, a write back/memory write stage 1018, an exception handling stage 1022, and a commit stage 1024.

FIG. 10B shows processor core 1090 including a front end unit 1030 coupled to an execution engine unit 1050, and both are coupled to a memory unit 1070. The core 1090 may be a reduced instruction set computing (RISC) core, a complex instruction set computing (CISC) core, a very long instruction word (VLIW) core, or a hybrid or alternative core type. As yet another option, the core 1090 may be a special-purpose core, such as, for example, a network or communication core, compression engine, coprocessor core, general purpose computing graphics processing unit (GPGPU) core, graphics core, or the like.

The front end unit 1030 includes a branch prediction unit 1032 coupled to an instruction cache unit 1034, which is coupled to an instruction translation lookaside buffer (TLB) 1036, which is coupled to an instruction fetch unit 1038, which is coupled to a decode unit 1040. The decode unit 1040 (or decoder) may decode instructions, and generate as an output one or more micro-operations, micro-code entry points, microinstructions, other instructions, or other control signals, which are decoded from, or which otherwise reflect, or are derived from, the original instructions. The decode unit 1040 may be implemented using various different mechanisms. Examples of suitable mechanisms include, but are not limited to, look-up tables, hardware implementations, programmable logic arrays (PLAs), microcode read only memories (ROMs), etc. In one embodiment, the core 1090 includes a microcode ROM or other medium that stores microcode for certain macroinstructions (e.g., in decode unit 1040 or otherwise within the front end unit 1030). The decode unit 1040 is coupled to a rename/allocator unit 1052 in the execution engine unit 1050.

The execution engine unit 1050 includes the rename/allocator unit 1052 coupled to a retirement unit 1054 and a set of one or more scheduler unit(s) 1056. The scheduler unit(s) 1056 represents any number of different schedulers, including reservations stations, central instruction window, etc. The scheduler unit(s) 1056 is coupled to the physical register file(s) unit(s) 1058. Each of the physical register file(s) units 1058 represents one or more physical register files, different ones of which store one or more different data types, such as scalar integer, scalar floating point, packed integer, packed floating point, vector integer, vector floating point, status (e.g., an instruction pointer that is the address of the next instruction to be executed), etc. In one embodiment, the physical register file(s) unit 1058 comprises a vector registers unit, a write mask registers unit, and a scalar registers unit. These register units may provide architectural vector registers, vector mask registers, and general purpose registers. The physical register file(s) unit(s) 1058 is overlapped by the retirement unit 1054 to illustrate various ways in which register renaming and out-of-order execution may be implemented (e.g., using a reorder buffer(s) and a retirement register file(s); using a future file(s), a history buffer(s), and a retirement register file(s); using a register maps and a pool of registers; etc.). The retirement unit 1054 and the physical register file(s) unit(s) 1058 are coupled to the execution cluster(s) 1060. The execution cluster(s) 1060 includes a set of one or more execution units 1062 and a set of one or more memory access units 1064. The execution units 1062 may perform various operations (e.g., shifts, addition, subtraction, multiplication) and on various types of data (e.g., scalar floating point, packed integer, packed floating point, vector integer, vector floating point). While some embodiments may include a number of execution units dedicated to specific functions or sets of functions, other embodiments may include only one execution unit or multiple execution units that all perform all functions. The scheduler unit(s) 1056, physical register file(s) unit(s) 1058, and execution cluster(s) 1060 are shown as being possibly plural because certain embodiments create separate pipelines for certain types of data/operations (e.g., a scalar integer pipeline, a scalar floating point/packed integer/packed floating point/vector integer/vector floating point pipeline, and/or a memory access pipeline that each have their own scheduler unit, physical register file(s) unit, and/or execution cluster—and in the case of a separate memory access pipeline, certain embodiments are implemented in which only the execution cluster of this pipeline has the memory access unit(s) 1064). It should also be understood that where separate pipelines are used, one or more of these pipelines may be out-of-order issue/execution and the rest in-order.

The set of memory access units 1064 is coupled to the memory unit 1070, which includes a data TLB unit 1072 coupled to a data cache unit 1074 coupled to a level 2 (L2) cache unit 1076. In one exemplary embodiment, the memory access units 1064 may include a load unit, a store address unit, and a store data unit, each of which is coupled to the data TLB unit 1072 in the memory unit 1070. The instruction cache unit 1034 is further coupled to a level 2 (L2) cache unit 1076 in the memory unit 1070. The L2 cache unit 1076 is coupled to one or more other levels of cache and eventually to a main memory.

By way of example, the exemplary register renaming, out-of-order issue/execution core architecture may implement the pipeline 1000 as follows: 1) the instruction fetch 1038 performs the fetch and length decoding stages 1002 and 1004; 2) the decode unit 1040 performs the decode stage 1006; 3) the rename/allocator unit 1052 performs the allocation stage 1008 and renaming stage 1010; 4) the scheduler unit(s) 1056 performs the schedule stage 1012; 5) the physical register file(s) unit(s) 1058 and the memory unit 1070 perform the register read/memory read stage 1014; the execution cluster 1060 perform the execute stage 1016; 6) the memory unit 1070 and the physical register file(s) unit(s) 1058 perform the write back/memory write stage 1018; 7) various units may be involved in the exception handling stage 1022; and 8) the retirement unit 1054 and the physical register file(s) unit(s) 1058 perform the commit stage 1024.

The core 1090 may support one or more instructions sets (e.g., the x86 instruction set (with some extensions that have been added with newer versions); the MIPS instruction set of MIPS Technologies of Sunnyvale, Calif.; the ARM instruction set (with optional additional extensions such as NEON) of ARM Holdings of Sunnyvale, Calif.), including the instruction(s) described herein. In one embodiment, the core 1090 includes logic to support a packed data instruction set extension (e.g., AVX1, AVX2), thereby allowing the operations used by many multimedia applications to be performed using packed data.

It should be understood that the core may support multithreading (executing two or more parallel sets of operations or threads), and may do so in a variety of ways including time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyperthreading technology).

While register renaming is described in the context of out-of-order execution, it should be understood that register renaming may be used in an in-order architecture. While the illustrated embodiment of the processor also includes separate instruction and data cache units 1034/1074 and a shared L2 cache unit 1076, alternative embodiments may have a single internal cache for both instructions and data, such as, for example, a Level 1 (L1) internal cache, or multiple levels of internal cache. In some embodiments, the system may include a combination of an internal cache and an external cache that is external to the core and/or the processor. Alternatively, all of the cache may be external to the core and/or the processor.

Specific Exemplary In-Order Core Architecture

Figure 11B:
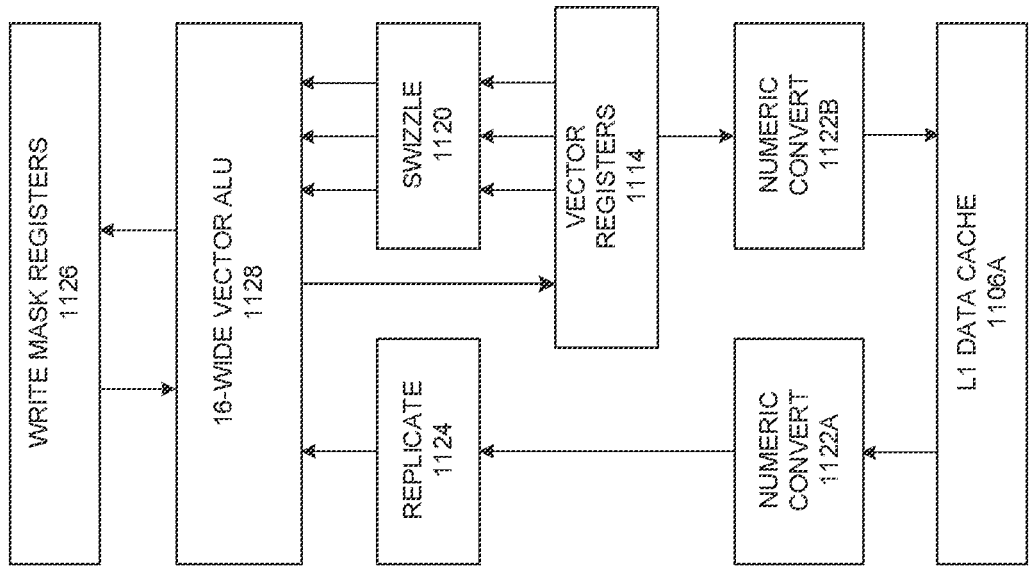
FIG. 11B is a block diagram of an embodiment of an expanded view of part of the processor core of FIG. 11A.
Figure 11A:
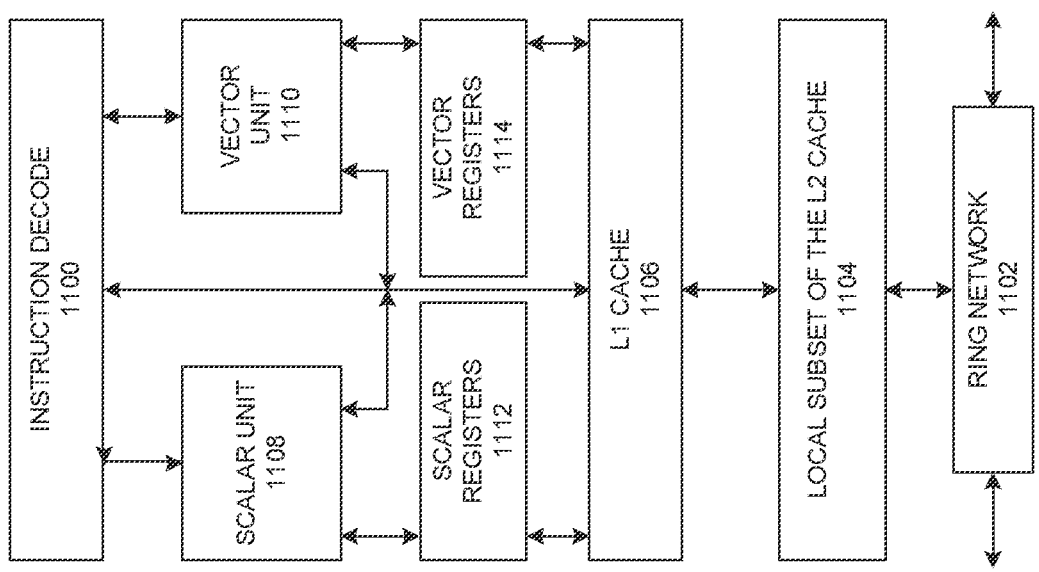
FIG. 11A is a block diagram of an embodiment of a single processor core, along with its connection to the on-die interconnect network, and with its local subset of the Level 2 (L2) cache.

FIGS. 11A-B illustrate a block diagram of a more specific exemplary in-order core architecture, which core would be one of several logic blocks (including other cores of the same type and/or different types) in a chip. The logic blocks communicate through a high-bandwidth interconnect network (e.g., a ring network) with some fixed function logic, memory I/O interfaces, and other necessary I/O logic, depending on the application.

FIG. 11A is a block diagram of a single processor core, along with its connection to the on-die interconnect network 1102 and with its local subset of the Level 2 (L2) cache 1104, according to embodiments of the invention. In one embodiment, an instruction decoder 1100 supports the x86 instruction set with a packed data instruction set extension. An L1 cache 1106 allows low-latency accesses to cache memory into the scalar and vector units. While in one embodiment (to simplify the design), a scalar unit 1108 and a vector unit 1110 use separate register sets (respectively, scalar registers 11112 and vector registers 1114) and data transferred between them is written to memory and then read back in from a level 1 (L1) cache 1106, alternative embodiments of the invention may use a different approach (e.g., use a single register set or include a communication path that allow data to be transferred between the two register files without being written and read back).

The local subset of the L2 cache 1104 is part of a global L2 cache that is divided into separate local subsets, one per processor core. Each processor core has a direct access path to its own local subset of the L2 cache 1104. Data read by a processor core is stored in its L2 cache subset 1104 and can be accessed quickly, in parallel with other processor cores accessing their own local L2 cache subsets. Data written by a processor core is stored in its own L2 cache subset 1104 and is flushed from other subsets, if necessary. The ring network ensures coherency for shared data. The ring network is bi-directional to allow agents such as processor cores, L2 caches and other logic blocks to communicate with each other within the chip. Each ring data-path is 1012-bits wide per direction.

FIG. 11B is an expanded view of part of the processor core in FIG. 11A according to embodiments of the invention. FIG. 11B includes an L1 data cache 1106A part of the L1 cache 1104, as well as more detail regarding the vector unit 1110 and the vector registers 1114. Specifically, the vector unit 1110 is a 16-wide vector processing unit (VPU) (see the 16-wide ALU 1128), which executes one or more of integer, single-precision float, and double-precision float instructions. The VPU supports swizzling the register inputs with swizzle unit 1120, numeric conversion with numeric convert units 1122A-B, and replication with replication unit 1124 on the memory input. Write mask registers 1126 allow predicating resulting vector writes.

Processor with Integrated Memory Controller and Graphics

Figure 12:
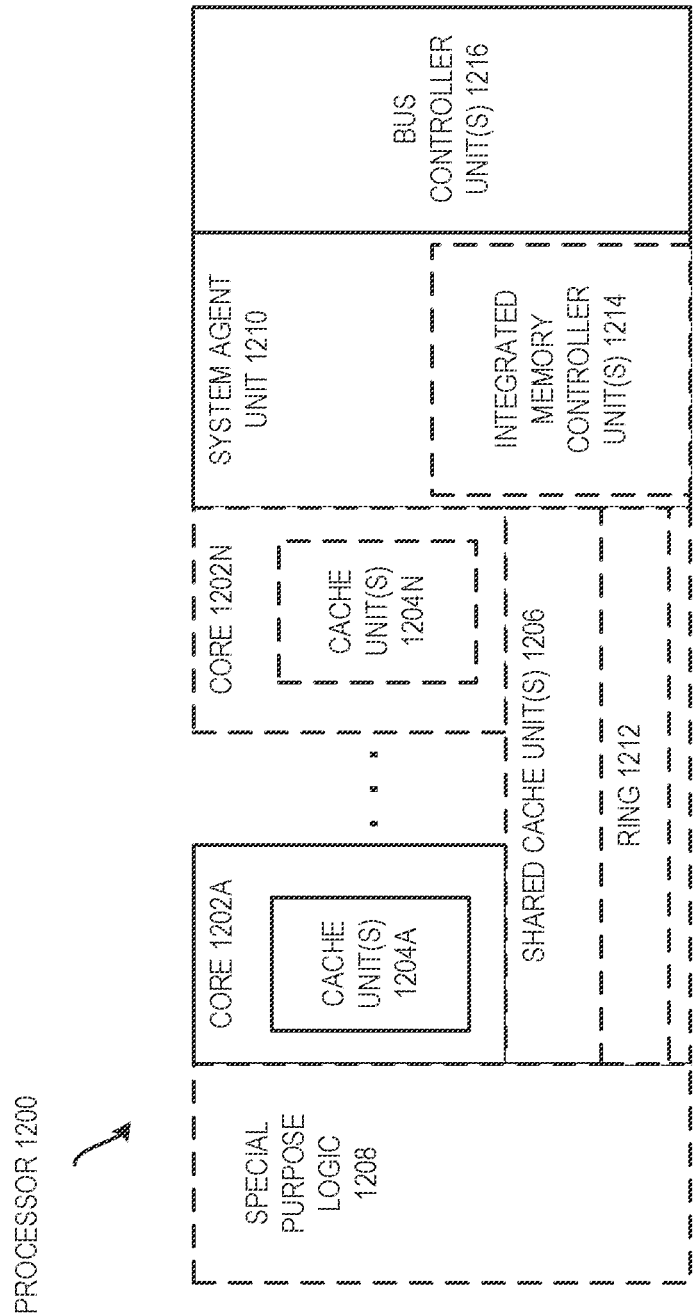
FIG. 12 is a block diagram of an embodiment of a processor that may have more than one core, may have an integrated memory controller, and may have integrated graphics.

FIG. 12 is a block diagram of a processor 1200 that may have more than one core, may have an integrated memory controller, and may have integrated graphics according to embodiments of the invention. The solid lined boxes in FIG. 12 illustrate a processor 1200 with a single core 1202A, a system agent 1210, a set of one or more bus controller units 1216, while the optional addition of the dashed lined boxes illustrates an alternative processor 1200 with multiple cores 1202A-N, a set of one or more integrated memory controller unit(s) 1214 in the system agent unit 1210, and special purpose logic 1208.

Thus, different implementations of the processor 1200 may include: 1) a CPU with the special purpose logic 1208 being integrated graphics and/or scientific (throughput) logic (which may include one or more cores), and the cores 1202A-N being one or more general purpose cores (e.g., general purpose in-order cores, general purpose out-of-order cores, a combination of the two); 2) a coprocessor with the cores 1202A-N being a large number of special purpose cores intended primarily for graphics and/or scientific (throughput); and 3) a coprocessor with the cores 1202A-N being a large number of general purpose in-order cores. Thus, the processor 1200 may be a general-purpose processor, coprocessor or special-purpose processor, such as, for example, a network or communication processor, compression engine, graphics processor, GPGPU (general purpose graphics processing unit), a high-throughput many integrated core (MIC) coprocessor (including 30 or more cores), embedded processor, or the like. The processor may be implemented on one or more chips. The processor 1200 may be a part of and/or may be implemented on one or more substrates using any of a number of process technologies, such as, for example, BiCMOS, CMOS, or NMOS.

The memory hierarchy includes one or more levels of cache within the cores, a set or one or more shared cache units 1206, and external memory (not shown) coupled to the set of integrated memory controller units 1214. The set of shared cache units 1206 may include one or more mid-level caches, such as level 2 (L2), level 3 (L3), level 4 (L4), or other levels of cache, a last level cache (LLC), and/or combinations thereof. While in one embodiment a ring based interconnect unit 1212 interconnects the integrated graphics logic 1208, the set of shared cache units 1206, and the system agent unit 1210/integrated memory controller unit(s) 1214, alternative embodiments may use any number of well-known techniques for interconnecting such units. In one embodiment, coherency is maintained between one or more cache units 1206 and cores 1202-A-N.

In some embodiments, one or more of the cores 1202A-N are capable of multi-threading. The system agent 1210 includes those components coordinating and operating cores 1202A-N. The system agent unit 1210 may include for example a power control unit (PCU) and a display unit. The PCU may be or include logic and components needed for regulating the power state of the cores 1202A-N and the integrated graphics logic 1208. The display unit is for driving one or more externally connected displays.

The cores 1202A-N may be homogenous or heterogeneous in terms of architecture instruction set; that is, two or more of the cores 1202A-N may be capable of execution the same instruction set, while others may be capable of executing only a subset of that instruction set or a different instruction set.

Exemplary Computer Architectures

FIGS. 13-21 are block diagrams of exemplary computer architectures. Other system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable. In general, a huge variety of systems or electronic devices capable of incorporating a processor and/or other execution logic as disclosed herein are generally suitable.

Figure 13:
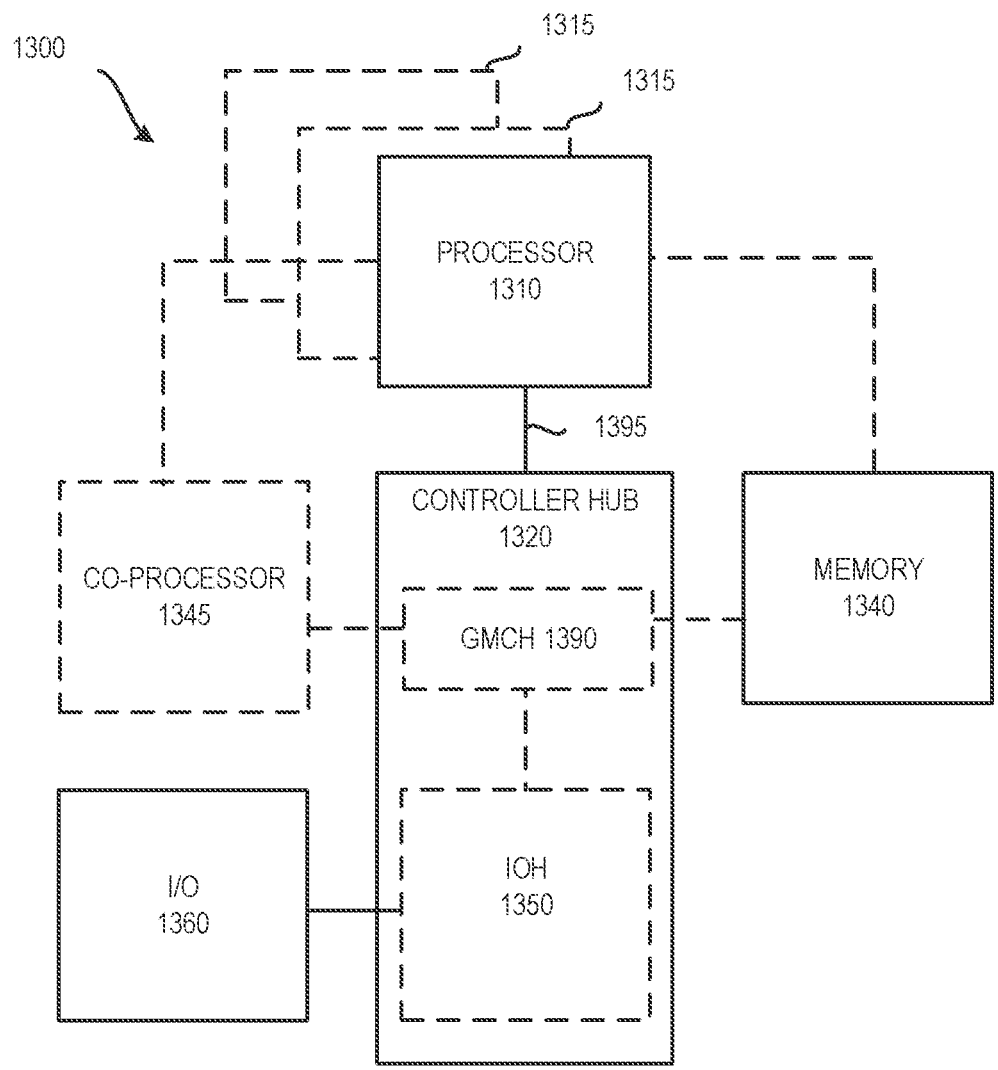
FIG. 13 is a block diagram of a first embodiment of a computer architecture.

Referring now to FIG. 13, shown is a block diagram of a system 1300 in accordance with one embodiment of the present invention. The system 1300 may include one or more processors 1310, 1315, which are coupled to a controller hub 1320. In one embodiment the controller hub 1320 includes a graphics memory controller hub (GMCH) 1390 and an Input/Output Hub (IOH) 1350 (which may be on separate chips); the GMCH 1390 includes memory and graphics controllers to which are coupled memory 1340 and a coprocessor 1345; the IOH 1350 is couples input/output (I/O) devices 1360 to the GMCH 1390. Alternatively, one or both of the memory and graphics controllers are integrated within the processor (as described herein), the memory 1340 and the coprocessor 1345 are coupled directly to the processor 1310, and the controller hub 1320 in a single chip with the IOH 1350.

The optional nature of additional processors 1315 is denoted in FIG. 13 with broken lines. Each processor 1310, 1315 may include one or more of the processing cores described herein and may be some version of the processor 1200.

The memory 1340 may be, for example, dynamic random access memory (DRAM), phase change memory (PCM), or a combination of the two. For at least one embodiment, the controller hub 1320 communicates with the processor(s) 1310, 1315 via a multi-drop bus, such as a frontside bus (FSB), point-to-point interface such as QuickPath Interconnect (QPI), or similar connection 1395.

In one embodiment, the coprocessor 1345 is a special-purpose processor, such as, for example, a high-throughput MIC processor, a network or communication processor, compression engine, graphics processor, GPGPU, embedded processor, or the like. In one embodiment, controller hub 1320 may include an integrated graphics accelerator.

There can be a variety of differences between the physical resources 1310, 1315 in terms of a spectrum of metrics of merit including architectural, microarchitectural, thermal, power consumption characteristics, and the like.

In one embodiment, the processor 1310 executes instructions that control data processing operations of a general type. Embedded within the instructions may be coprocessor instructions. The processor 1310 recognizes these coprocessor instructions as being of a type that should be executed by the attached coprocessor 1345. Accordingly, the processor 1310 issues these coprocessor instructions (or control signals representing coprocessor instructions) on a coprocessor bus or other interconnect, to coprocessor 1345. Coprocessor(s) 1345 accept and execute the received coprocessor instructions.

Figure 14:
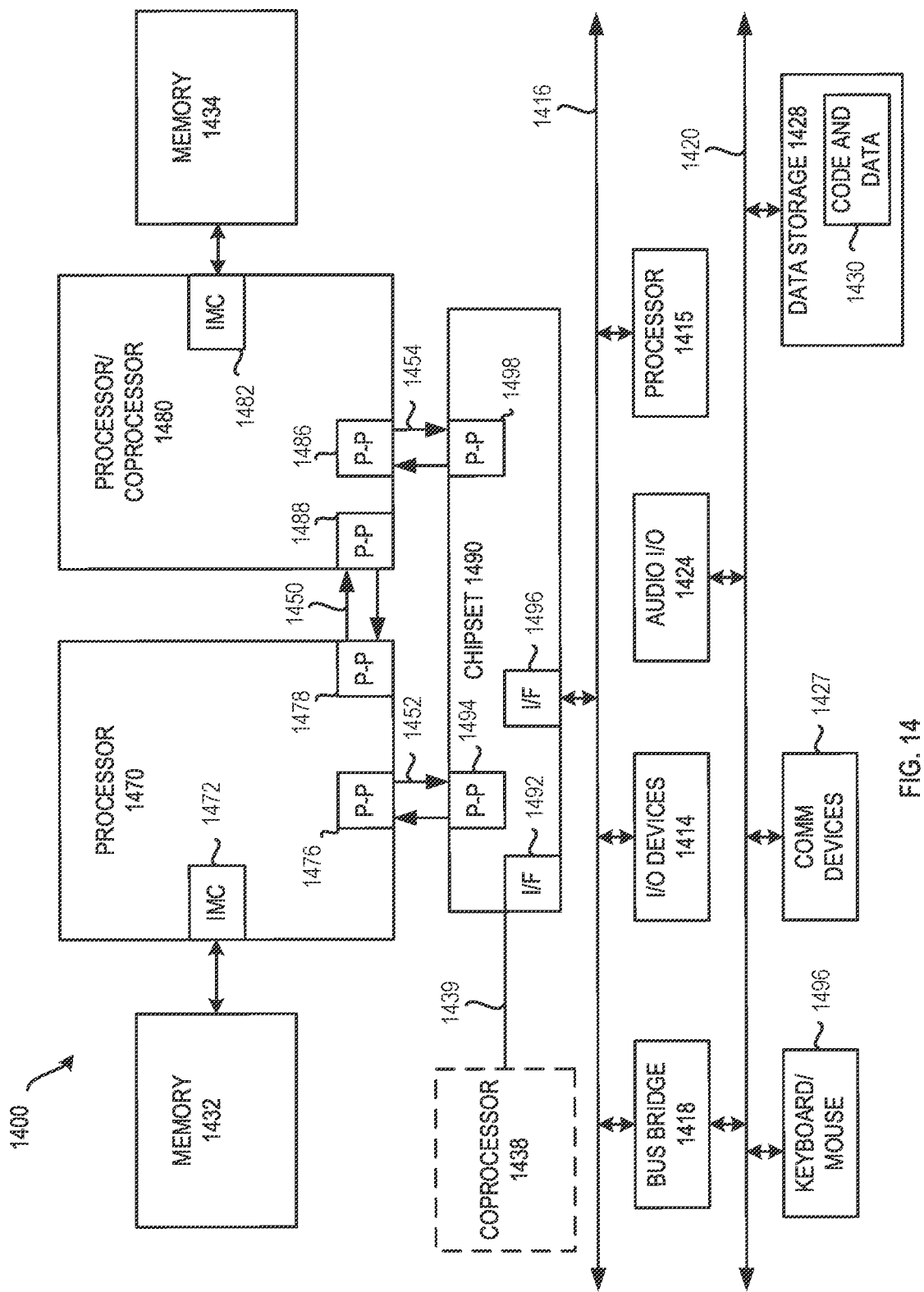
FIG. 14 is a block diagram of a second embodiment of a computer architecture.

Referring now to FIG. 14, shown is a block diagram of a first more specific exemplary system 1400 in accordance with an embodiment of the present invention. As shown in FIG. 14, multiprocessor system 1400 is a point-to-point interconnect system, and includes a first processor 1470 and a second processor 1480 coupled via a point-to-point interconnect 1450. Each of processors 1470 and 1480 may be some version of the processor 1200. In one embodiment of the invention, processors 1470 and 1480 are respectively processors 1310 and 1315, while coprocessor 1438 is coprocessor 1345. In another embodiment, processors 1470 and 1480 are respectively processor 1310 coprocessor 1345.

Processors 1470 and 1480 are shown including integrated memory controller (IMC) units 1472 and 1482, respectively. Processor 1470 also includes as part of its bus controller units point-to-point (P-P) interfaces 1476 and 1478; similarly, second processor 1480 includes P-P interfaces 1486 and 1488. Processors 1470, 1480 may exchange information via a point-to-point (P-P) interface 1450 using P-P interface circuits 1478, 1488. As shown in FIG. 14, IMCs 1472 and 1482 couple the processors to respective memories, namely a memory 1432 and a memory 1434, which may be portions of main memory locally attached to the respective processors.

Processors 1470, 1480 may each exchange information with a chipset 1490 via individual P-P interfaces 1452, 1454 using point to point interface circuits 1476, 1494, 1486, 1498. Chipset 1490 may optionally exchange information with the coprocessor 1438 via a high-performance interface 1439. In one embodiment, the coprocessor 1438 is a special-purpose processor, such as, for example, a high-throughput MIC processor, a network or communication processor, compression engine, graphics processor, GPGPU, embedded processor, or the like.

A shared cache (not shown) may be included in either processor or outside of both processors, yet connected with the processors via P-P interconnect, such that either or both processors' local cache information may be stored in the shared cache if a processor is placed into a low power mode.

Chipset 1490 may be coupled to a first bus 1416 via an interface 1496. In one embodiment, first bus 1416 may be a Peripheral Component Interconnect (PCI) bus, or a bus such as a PCI Express bus or another third generation I/O interconnect bus, although the scope of the present invention is not so limited.

As shown in FIG. 14, various I/O devices 1414 may be coupled to first bus 1416, along with a bus bridge 1418 which couples first bus 1416 to a second bus 1420. In one embodiment, one or more additional processor(s) 1415, such as coprocessors, high-throughput MIC processors, GPGPU's, accelerators (such as, e.g., graphics accelerators or digital signal processing (DSP) units), field programmable gate arrays, or any other processor, are coupled to first bus 1416. In one embodiment, second bus 1420 may be a low pin count (LPC) bus. Various devices may be coupled to a second bus 1420 including, for example, a keyboard and/or mouse 1422, communication devices 1427 and a storage unit 1428 such as a disk drive or other mass storage device which may include instructions/code and data 1430, in one embodiment. Further, an audio I/O 1424 may be coupled to the second bus 1420. Note that other architectures are possible. For example, instead of the point-to-point architecture of FIG. 14, a system may implement a multi-drop bus or other such architecture.

Figure 15:
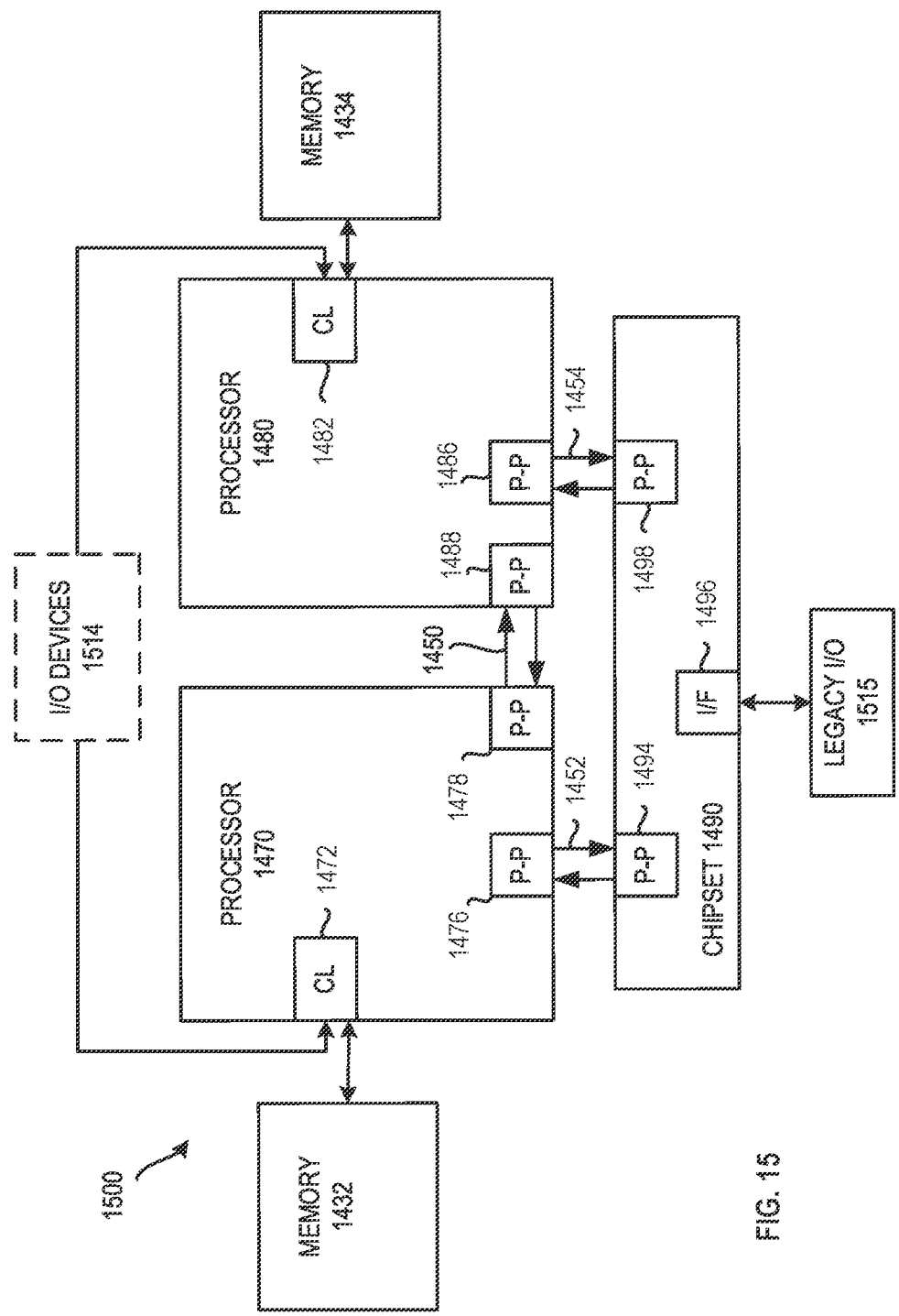
FIG. 15 is a block diagram of a third embodiment of a computer architecture.

Referring now to FIG. 15, shown is a block diagram of a second more specific exemplary system 1500 in accordance with an embodiment of the present invention. Like elements in FIGS. 14 and 15 bear like reference numerals, and certain aspects of FIG. 14 have been omitted from FIG. 15 in order to avoid obscuring other aspects of FIG. 15.

FIG. 15 illustrates that the processors 1470, 1480 may include integrated memory and I/O control logic ("CL") 1472 and 1482, respectively. Thus, the CL 1472, 1482 include integrated memory controller units and include I/O control logic. FIG. 15 illustrates that not only are the memories 1432, 1434 coupled to the CL 1472, 1482, but also that I/O devices 1514 are also coupled to the control logic 1472, 1482. Legacy I/O devices 1515 are coupled to the chipset 1490.

Figure 16:
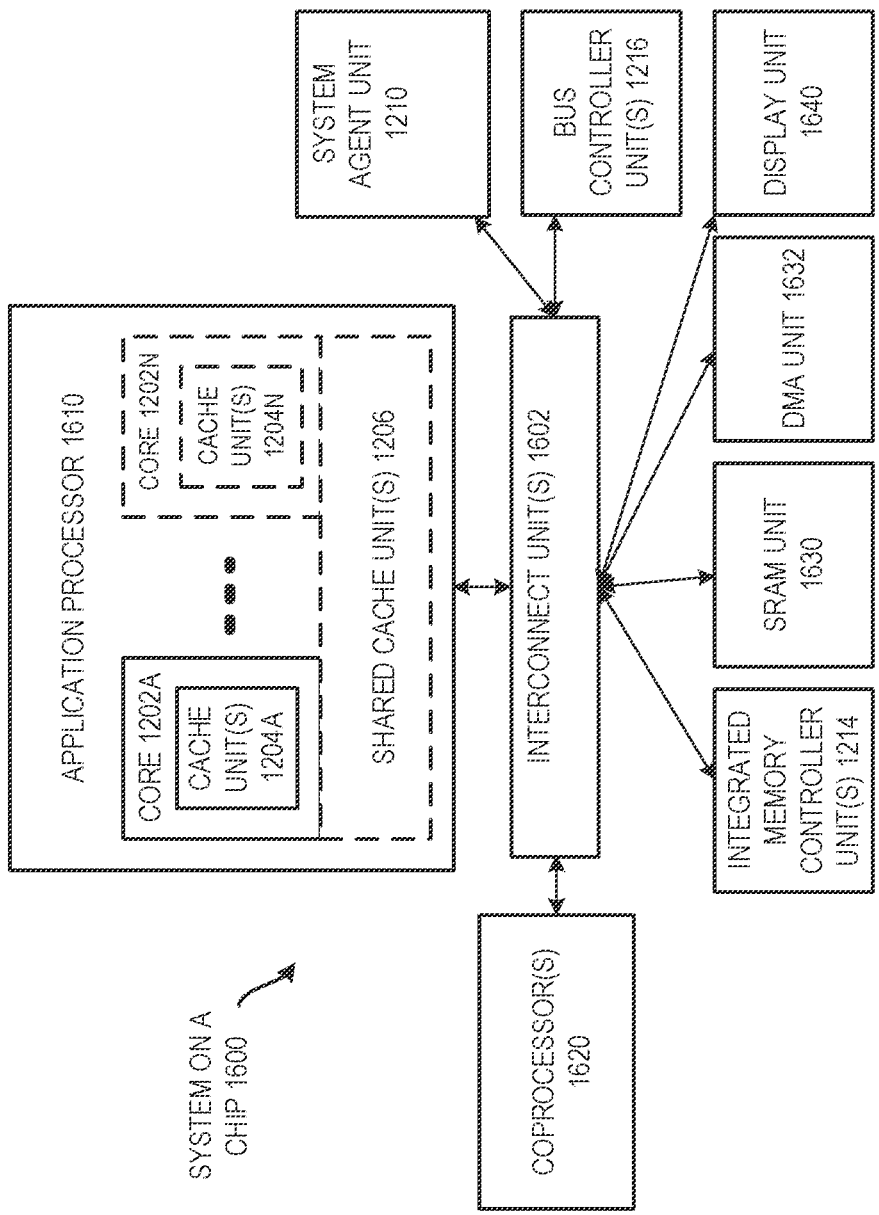
FIG. 16 is a block diagram of a fourth embodiment of a computer architecture.

Referring now to FIG. 16, shown is a block diagram of a SoC 1600 in accordance with an embodiment of the present invention. Similar elements in FIG. 12 bear like reference numerals. Also, dashed lined boxes are optional features on more advanced SoCs. In FIG. 16, an interconnect unit(s) 1602 is coupled to: an application processor 1610 which includes a set of one or more cores 152A-N and shared cache unit(s) 1206; a system agent unit 1210; a bus controller unit(s) 1216; an integrated memory controller unit(s) 1214; a set or one or more coprocessors 1620 which may include integrated graphics logic, an image processor, an audio processor, and a video processor; an static random access memory (SRAM) unit 1630; a direct memory access (DMA) unit 1632; and a display unit 1640 for coupling to one or more external displays. In one embodiment, the coprocessor(s) 1620 include a special-purpose processor, such as, for example, a network or communication processor, compression engine, GPGPU, a high-throughput MIC processor, embedded processor, or the like.

Embodiments of the mechanisms disclosed herein may be implemented in hardware, software, firmware, or a combination of such implementation approaches. Embodiments of the invention may be implemented as computer programs or program code executing on programmable systems comprising at least one processor, a storage system (including volatile and non-volatile memory and/or storage elements), at least one input device, and at least one output device.

Program code, such as code 1430 illustrated in FIG. 14, may be applied to input instructions to perform the functions described herein and generate output information. The output information may be applied to one or more output devices, in known fashion. For purposes of this application, a processing system includes any system that has a processor, such as, for example; a digital signal processor (DSP), a microcontroller, an application specific integrated circuit (ASIC), or a microprocessor.

The program code may be implemented in a high level procedural or object oriented programming language to communicate with a processing system. The program code may also be implemented in assembly or machine language, if desired. In fact, the mechanisms described herein are not limited in scope to any particular programming language. In any case, the language may be a compiled or interpreted language.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

Such machine-readable storage media may include, without limitation, non-transitory, tangible arrangements of articles manufactured or formed by a machine or device, including storage media such as hard disks, any other type of disk including floppy disks, optical disks, compact disk read-only memories (CD-ROMs), compact disk rewritable's (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), phase change memory (PCM), magnetic or optical cards, or any other type of media suitable for storing electronic instructions.

Accordingly, embodiments of the invention also include non-transitory, tangible machine-readable media containing instructions or containing design data, such as Hardware Description Language (HDL), which defines structures, circuits, apparatuses, processors and/or system features described herein. Such embodiments may also be referred to as program products.

Emulation (Including Binary Translation, Code Morphing, Etc.)

In some cases, an instruction converter may be used to convert an instruction from a source instruction set to a target instruction set. For example, the instruction converter may translate (e.g., using static binary translation, dynamic binary translation including dynamic compilation), morph, emulate, or otherwise convert an instruction to one or more other instructions to be processed by the core. The instruction converter may be implemented in software, hardware, firmware, or a combination thereof. The instruction converter may be on processor, off processor, or part on and part off processor.

Figure 17:
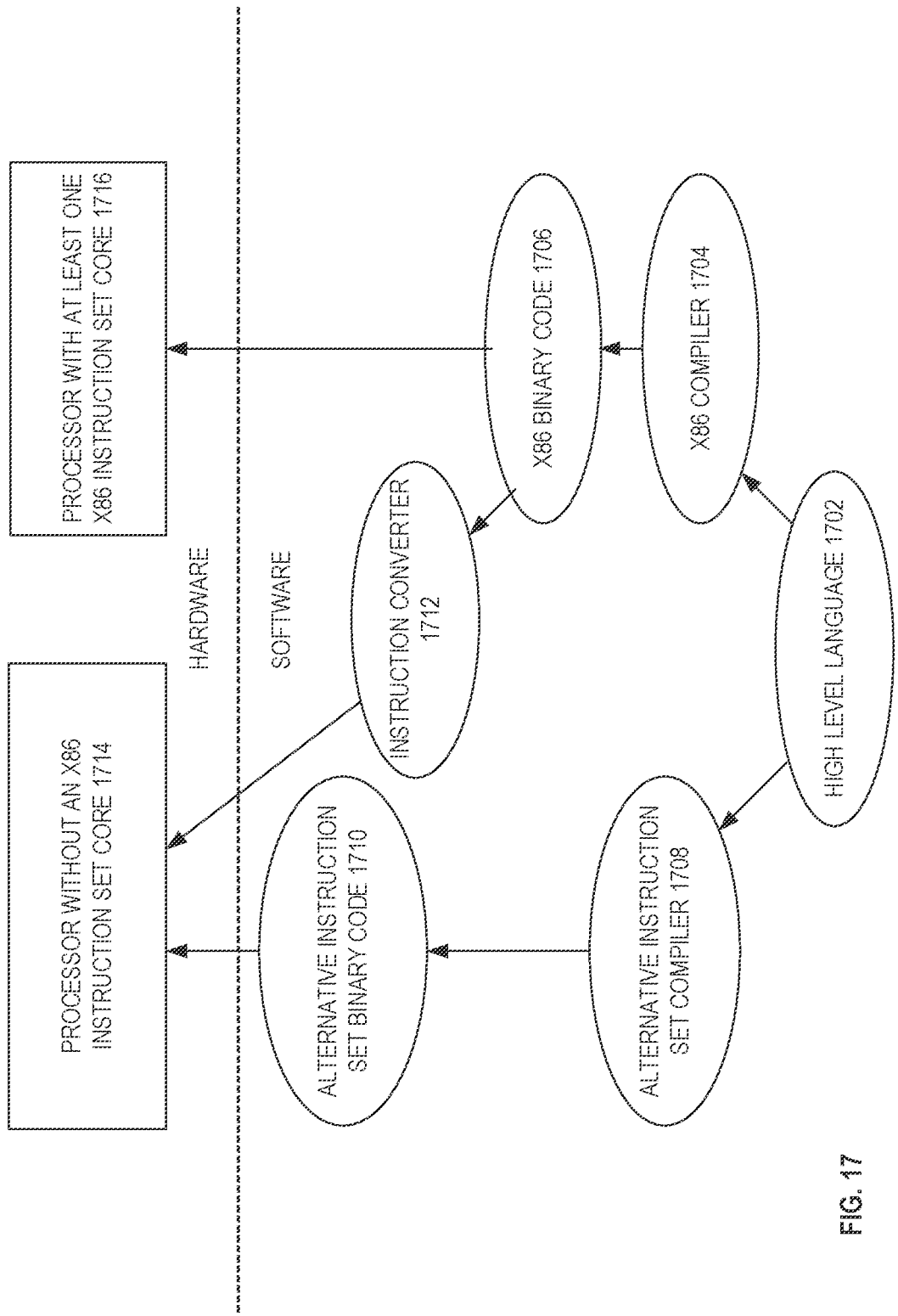
FIG. 17 is a block diagram of use of a software instruction converter to convert binary instructions in a source instruction set to binary instructions in a target instruction set, according to embodiments of the invention.

FIG. 17 is a block diagram contrasting the use of a software instruction converter to convert binary instructions in a source instruction set to binary instructions in a target instruction set according to embodiments of the invention. In the illustrated embodiment, the instruction converter is a software instruction converter, although alternatively the instruction converter may be implemented in software, firmware, hardware, or various combinations thereof. FIG. 17 shows a program in a high level language 1702 may be compiled using an x86 compiler 1704 to generate x86 binary code 1706 that may be natively executed by a processor with at least one x86 instruction set core 1716. The processor with at least one x86 instruction set core 1716 represents any processor that can perform substantially the same functions as an Intel processor with at least one x86 instruction set core by compatibly executing or otherwise processing (1) a substantial portion of the instruction set of the Intel x86 instruction set core or (2) object code versions of applications or other software targeted to run on an Intel processor with at least one x86 instruction set core, in order to achieve substantially the same result as an Intel processor with at least one x86 instruction set core. The x86 compiler 1704 represents a compiler that is operable to generate x86 binary code 1706 (e.g., object code) that can, with or without additional linkage processing, be executed on the processor with at least one x86 instruction set core 1716. Similarly, FIG. 17 shows the program in the high level language 1702 may be compiled using an alternative instruction set compiler 1708 to generate alternative instruction set binary code 1710 that may be natively executed by a processor without at least one x86 instruction set core 1714 (e.g., a processor with cores that execute the MIPS instruction set of MIPS Technologies of Sunnyvale, Calif. and/or that execute the ARM instruction set of ARM Holdings of Sunnyvale, Calif.). The instruction converter 1712 is used to convert the x86 binary code 1706 into code that may be natively executed by the processor without an x86 instruction set core 1714. This converted code is not likely to be the same as the alternative instruction set binary code 1710 because an instruction converter capable of this is difficult to make; however, the converted code will accomplish the general operation and be made up of instructions from the alternative instruction set. Thus, the instruction converter 1712 represents software, firmware, hardware, or a combination thereof that, through emulation, simulation or any other process, allows a processor or other electronic device that does not have an x86 instruction set processor or core to execute the x86 binary code 1706.

Components, features, and details described for any of the processors disclosed herein may optionally apply to any of the methods disclosed herein, which in embodiments may optionally be performed by and/or with such processors. Any of the processors described herein in embodiments may optionally be included in any of the systems disclosed herein. Any of the instructions disclosed herein in embodiments may optionally be performed by and/or with any of the processors disclosed herein, optionally in some embodiments having any of the microarchitectures shown herein, and optionally in some embodiments included in any of the systems shown herein. Accordingly, features and details described for any of the instructions disclosed herein may in some embodiments therefore optionally apply to any of the processors and/or systems disclosed herein which may be used to perform those instructions.

Processor components disclosed herein may be said to be operative, configured, capable, or able to perform an operation. For example, a decoder may be to decode an instruction, an execution unit may be to store a result, etc. For clarity, it is to be understood that these expressions do not imply that the processor components are in operation or use, but rather refer to what the processor components are capable of doing or able to do when they are in operation, but in the apparatus claims these processor components are not in operation.

In the description and claims, the terms "coupled" and/or "connected," along with their derivatives, may have be used. These terms are not intended as synonyms for each other. Rather, in embodiments, "connected" may be used to indicate that two or more elements are in direct physical and/or electrical contact with each other. "Coupled" may mean that two or more elements are in direct physical and/or electrical contact with each other. However, "coupled" may also mean that two or more elements are not in direct contact with each other, but yet still co-operate or interact with each other. For example, an execution unit may be coupled with a register and/or a decode unit through one or more intervening components. In the figures, arrows are used to show connections and couplings.

The components disclosed herein and the methods depicted in the preceding figures may be implemented with logic, modules, or units that includes hardware (e.g., transistors, gates, circuitry, etc.), firmware (e.g., a non-volatile memory storing microcode or control signals), software (e.g., stored on a non-transitory computer readable storage medium), or a combination thereof. In some embodiments, the logic, modules, or units may include at least some or predominantly a mixture of hardware and/or firmware potentially combined with some optional software.

The term "and/or" may have been used. As used herein, the term "and/or" means one or the other or both (e.g., A and/or B means A or B or both A and B).

In the description above, specific details have been set forth in order to provide a thorough understanding of the embodiments. However, other embodiments may be practiced without some of these specific details. The scope of the invention is not to be determined by the specific examples provided above, but only by the claims below. In other instances, well-known circuits, structures, devices, and operations have been shown in block diagram form and/or without detail in order to avoid obscuring the understanding of the description. Where considered appropriate, reference numerals, or terminal portions of reference numerals, have been repeated among the figures to indicate corresponding or analogous elements, which may optionally have similar or the same characteristics, unless specified or clearly apparent otherwise.

Certain operations may be performed by hardware components, or may be embodied in machine-executable or circuit-executable instructions, that may be used to cause and/or result in a machine, circuit, or hardware component (e.g., a processor, portion of a processor, circuit, etc.) programmed with the instructions performing the operations. The operations may also optionally be performed by a combination of hardware and software. A processor, machine, circuit, or hardware may include specific or particular circuitry or other logic (e.g., hardware potentially combined with firmware and/or software) is operative to execute and/or process the instruction and store a result in response to the instruction.

Some embodiments include an article of manufacture (e.g., a computer program product) that includes a machine-readable medium. The medium may include a mechanism that provides, for example stores, information in a form that is readable by the machine. The machine-readable medium may provide, or have stored thereon, an instruction or sequence of instructions, that if and/or when executed by a machine are operative to cause the machine to perform and/or result in the machine performing one or operations, methods, or techniques disclosed herein.

In some embodiments, the machine-readable medium may include a tangible and/or non-transitory machine-readable storage medium. For example, the non-transitory machine-readable storage medium may include a floppy diskette, an optical storage medium, an optical disk, an optical data storage device, a CD-ROM, a magnetic disk, a magneto-optical disk, a read only memory (ROM), a programmable ROM (PROM), an erasable-and-programmable ROM (EPROM), an electrically-erasable-and-programmable ROM (EEPROM), a random access memory (RAM), a static-RAM (SRAM), a dynamic-RAM (DRAM), a Flash memory, a phase-change memory, a phase-change data storage material, a non-volatile memory, a non-volatile data storage device, a non-transitory memory, a non-transitory data storage device, or the like. The non-transitory machine-readable storage medium does not consist of a transitory propagated signal. In some embodiments, the storage medium may include a tangible medium that includes solid-state matter or material, such as, for example, a semiconductor material, a phase change material, a magnetic solid material, a solid data storage material, etc. Alternatively, a non-tangible transitory computer-readable transmission media, such as, for example, an electrical, optical, acoustical or other form of propagated signals—such as carrier waves, infrared signals, and digital signals, may optionally be used.

Examples of suitable machines include, but are not limited to, a general-purpose processor, a special-purpose processor, a digital logic circuit, an integrated circuit, or the like. Still other examples of suitable machines include a computer system or other electronic device that includes a processor, a digital logic circuit, or an integrated circuit. Examples of such computer systems or electronic devices include, but are not limited to, desktop computers, laptop computers, notebook computers, tablet computers, netbooks, smartphones, cellular phones, servers, network devices (e.g., routers and switches), Mobile Internet devices (MIDs), media players, smart televisions, nettops, set-top boxes, and video game controllers.

Reference throughout this specification to "one embodiment," "an embodiment," "one or more embodiments," "some embodiments," for example, indicates that a particular feature may be included in the practice of the invention but is not necessarily required to be. Similarly, in the description various features are sometimes grouped together in a single embodiment, Figure, or description thereof for the purpose of streamlining the disclosure and aiding in the understanding of various inventive aspects. This method of disclosure, however, is not to be interpreted as reflecting an intention that the invention requires more features than are expressly recited in each claim. Rather, as the following claims reflect, inventive aspects lie in less than all features of a single disclosed embodiment. Thus, the claims following the Detailed Description are hereby expressly incorporated into this Detailed Description, with each claim standing on its own as a separate embodiment of the invention.

Example Embodiments

The following examples pertain to further embodiments. Specifics in the examples may be used anywhere in one or more embodiments.

Example 1 is a processor including a register to store a condition code bit, a decode unit to decode a bit check instruction, the bit check instruction to indicate a first source operand that is to include a first bit, and to indicate a check bit value for the first bit, and an execution unit coupled with the decode unit, the execution unit. In response to the bit check instruction, to compare the first bit with the check bit value, and update the condition code bit to indicate whether the first bit equals or does not equal the check bit value.

Example 2 includes the processor of Example 1, optionally in which the decode unit is to decode the bit check instruction that is to indicate a value to identify a bit position for the first bit as being any one of a plurality of different bit positions.

Example 3 includes the processor of Example 1, optionally in which the decode unit is to decode the bit check instruction which is to have an implicitly indicated, but not explicitly specified, fixed bit position for the first bit.

Example 4 includes the processor of Example 1, optionally in which the condition code bit is a zero condition code bit, and optionally in which the execution unit, in response to the instruction, is to set the zero condition code bit if the first bit equals the check bit value.

Example 5 includes the processor of Example 1, optionally in which the decode unit is to decode the bit check instruction that is to indicate a disable control, and optionally in which the execution unit, in response to the instruction, when the disable control is active, is to update the condition code bit in a same way regardless of whether the first bit equals or does not equal the check bit value.

Example 6 includes the processor of Example 5, optionally in which the condition code bit is a zero condition code bit, and optionally in which the execution unit, in response to the instruction, when the disable control is active, is to set the zero condition code bit regardless of whether the first bit equals or does not equal the check bit value.

Example 7 includes the processor of any one of Examples 1 to 6, optionally in which the decode unit is to decode the bit check instruction that is to indicate the first source operand which is to be a memory pointer.

Example 8 includes the processor of Example 7, optionally in which the first bit is to be a metadata bit of the memory pointer which is to be in one or more most significant bits of the memory pointer and which is not to be used during address translation for purposes of identify a physical memory location.

Example 9 includes the processor of Example 8, optionally in which first bit is to be a mark bit for garbage collection.

Example 10 includes the processor of any one of Examples 1 to 6, optionally in which the decode unit is to decode the bit check instruction that is able to indicate the check bit value to be either one of binary one and binary zero.

Example 11 includes the processor of any one of Examples 1 to 6, optionally in which the decode unit is to decode the bit check instruction that is to indicate a second source operand that is to include a plurality of check bit values that are each to correspond to a different one of a plurality of bits that are to represent only a subset of all bits of the first source operand.

Example 12 includes the processor of Example 11, optionally in which the execution unit, in response to the instruction, is to compare each of the check bit values with said corresponding one of the plurality of bits of the first source operand, and update a different corresponding condition code bit for each of the plurality of bits of the first source operand to indicate whether said each of the plurality of bits of the first source operand equals or does not equal the corresponding check bit value.

Example 13 includes the processor of any one of Examples 1 to 6, optionally in which the decode unit is to decode the bit check instruction that is to indicate a second source operand that is to include the check bit value.

Example 14 includes the processor of any one of Examples 1 to 6, optionally in which the execution unit includes an XOR gate to compare the first bit with the check bit value.

Example 15 is a method performed by a processor including receiving a bit check instruction at the processor, the bit check instruction indicating a first source operand that includes a first bit, and indicating a check bit value for the first bit, comparing the first bit with the check bit value in response to the bit check instruction, and updating a condition code bit to indicate whether the first bit equals or does not equal the check bit value in response to the bit check instruction.

Example 16 includes the method of Example 15, optionally in which receiving includes receiving the bit check instruction that indicates a value that identifies a bit position for the first bit as any one of a plurality of different possible bit positions.

Example 17 includes the method of Example 15, optionally in which receiving includes receiving the bit check instruction that indicates a disable control that is capable of being configured to cause the condition code bit to be updated in a same way regardless of whether the first bit equals or does not equal the check bit value.

Example 18 includes the method of Example 15, optionally in which receiving includes receiving the bit check instruction that indicates the first source operand which is to be a memory pointer.

Example 19 includes the method of Example 18, optionally in which the first bit is a metadata bit of the memory pointer that is not used during address translation for identifying a physical memory location.

Example 20 includes the method of Example 19, optionally in which first bit is a mark bit used in garbage collection.

Example 21 includes the method of Example 15, further including performing a control flow transfer instruction to make a control flow transfer to a garbage collector if the condition code bit indices the first bit does not equal the check bit value.

Example 22 is a system to process instructions including an interconnect, a processor coupled with the interconnect, the processor to receive a bit check instruction that is to indicate a first source operand that is to include a first bit, and is to indicate a check bit value for the first bit, the processor, in response to the bit check instruction, to compare the first bit with the check bit value, and update a condition code bit to indicate whether the first bit equals or does not equal the check bit value, and a dynamic random access memory (DRAM) coupled with the interconnect.

Example 23 includes the system of Example 22, optionally in which the bit check instruction is to indicate a value to identify a bit position for the first bit as being any one of a plurality of different bit positions.

Example 24 is an article of manufacture including a non-transitory machine-readable storage medium. The non-transitory machine-readable storage medium storing a plurality of instructions including a bit check instruction, the bit check instruction, if executed by a machine, is to cause the machine to perform operations including access a first source operand, which is to be indicated by the bit check instruction, the first source operand to include a first bit, access a check bit value for the first bit, which is to be indicated by the bit check instruction, compare the first bit with the check bit value in response to the bit check instruction, and update a condition code bit to indicate whether the first bit equals or does not equal the check bit value in response to the bit check instruction.

Example 25 includes the article of manufacture of Example 24, optionally in which first bit is a mark bit used in garbage collection.

Example 26 includes the processor of any one of Examples 1 to 14, further including an optional branch prediction unit to predict branches, and an optional instruction prefetch unit, coupled with the branch prediction unit, the instruction prefetch unit to prefetch instructions including the instruction. The processor may also optionally include an optional level 1 (L1) instruction cache coupled with the instruction prefetch unit, the L1 instruction cache to store instructions, an optional L1 data cache to store data, and an optional level 2 (L2) cache to store data and instructions. The processor may also optionally include an instruction fetch unit coupled with the decode unit, the L1 instruction cache, and the L2 cache, to fetch the instruction, in some cases from one of the L1 instruction cache and the L2 cache, and to provide the instruction to the decode unit. The processor may also optionally include a register rename unit to rename registers, an optional scheduler to schedule one or more operations that have been decoded from the instruction for execution, and an optional commit unit to commit execution results of the instruction.

Example 27 includes a system-on-chip that includes at least one interconnect, the processor of any one of Examples 1 to 14 coupled with the at least one interconnect, an optional graphics processing unit (GPU) coupled with the at least one interconnect, an optional digital signal processor (DSP) coupled with the at least one interconnect, an optional display controller coupled with the at least one interconnect, an optional memory controller coupled with the at least one interconnect, an optional wireless modem coupled with the at least one interconnect, an optional image signal processor coupled with the at least one interconnect, an optional Universal Serial Bus (USB) 3.0 compatible controller coupled with the at least one interconnect, an optional Bluetooth 4.1 compatible controller coupled with the at least one interconnect, and an optional wireless transceiver controller coupled with the at least one interconnect.

Example 28 is a processor or other apparatus operative to perform the method of any one of Examples 15 to 21.

Example 29 is a processor or other apparatus that includes means for performing the method of any one of Examples 15 to 21.

Example 30 is a processor or other apparatus that includes any combination of modules and/or units and/or logic and/or circuitry and/or means operative to perform the method of any one of Examples 15 to 21.

Example 31 is an optionally non-transitory and/or tangible machine-readable medium, which optionally stores or otherwise provides instructions including a first instruction, the first instruction if and/or when executed by a processor, computer system, electronic device, or other machine, is operative to cause the machine to perform the method of any one of Examples 15 to 21.

Example 32 is a processor or other apparatus substantially as described herein.

Example 33 is a processor or other apparatus that is operative to perform any method substantially as described herein.

Example 34 is a processor or other apparatus that is operative to perform any instruction substantially as described herein.

What is claimed is:

1. A processor comprising:
a register to store a condition code bit;
a decode unit to decode a bit check instruction, the bit check instruction to indicate a first source operand that is to include a first bit, and to indicate a check bit value for the first bit, wherein the check bit value is to be one selected from a group consisting of implicit to the bit check instruction, specified by a field of the bit check instruction, and specified by an operand of the bit check instruction; and
an execution unit coupled with the decode unit, the execution unit, in response to the bit check instruction, to:
compare the first bit with the check bit value; and
update the condition code bit to indicate whether the first bit equals or does not equal the check bit value.

2. The processor of claim 1, wherein the decode unit is to decode the bit check instruction that is to indicate a value to identify a bit position for the first bit as being any one of a plurality of different bit positions.

3. The processor of claim 1, wherein the decode unit is to decode the bit check instruction which is to have an implicitly indicated, but not explicitly specified, fixed bit position for the first bit.

4. The processor of claim 1, wherein the condition code bit is a zero condition code bit, and wherein the execution unit, in response to the instruction, is to set the zero condition code bit if the first bit equals the check bit value.

5. The processor of claim 1, wherein the decode unit is to decode the bit check instruction that is to indicate an enable control, and wherein the execution unit, in response to the instruction, when the enable control has a first value, is to update the condition code bit in a same way regardless of whether the first bit equals or does not equal the check bit value.

6. The processor of claim 5, wherein the condition code bit is a zero condition code bit, and wherein the execution unit, in response to the instruction, when the enable control has a first value, is to set the zero condition code bit regardless of whether the first bit equals or does not equal the check bit value.

7. The processor of claim 1, wherein the decode unit is to decode the bit check instruction that is to indicate the first source operand which is to be a memory pointer.

8. The processor of claim 7, wherein the first bit is to be a metadata bit of the memory pointer which is to be in one or more most significant bits of the memory pointer and which is not to be used during address translation for purposes of identify a physical memory location.

9. The processor of claim 8, wherein first bit is to be a mark bit for garbage collection.

10. The processor of claim 1, wherein the decode unit is to decode the bit check instruction that is able to indicate the check bit value to be either one of binary one and binary zero.

11. The processor of claim 1, wherein the decode unit is to decode the bit check instruction that is to indicate a second source operand that is to include a plurality of check bit values that are each to correspond to a different single bit of a plurality of bits that are to represent only a subset of all bits of the first source operand.

12. The processor of claim 11, wherein the execution unit, in response to the instruction, is to:
compare each of the check bit values with said corresponding one of the plurality of bits of the first source operand; and
update a different corresponding condition code bit for each of the plurality of bits of the first source operand to indicate whether said each of the plurality of bits of the first source operand equals or does not equal the corresponding check bit value.

13. The processor of claim 1, wherein the decode unit is to decode the bit check instruction that is to indicate a second source operand that is to include the check bit value.

14. The processor of claim 1, wherein the execution unit comprises an XOR gate to compare the first bit with the check bit value.

15. A method performed by a processor comprising:
decoding a bit check instruction of an instruction set of the processor with an on-die decode unit of the processor, the bit check instruction indicating a first source operand that includes a first bit, and indicating a check bit value for the first bit, wherein the check bit value is one selected from a group consisting of implicit to the bit check instruction, specified by a field of the bit check instruction, and specified by an operand of the bit check instruction, wherein the first source operand is a memory address operand having a plurality of least significant bits that are used to determine a memory address and a plurality of most significant bits available for use for one or more other purposes besides memory address determination, and wherein the first bit is one of the most significant bits;
comparing, with an on-die execution unit of the processor, the first bit with the check bit value in response to the bit check instruction; and
updating a condition code bit to indicate whether the first bit equals or does not equal the check bit value in response to the bit check instruction, wherein the first bit is a mark bit used in garbage collection.

16. The method of claim 15, wherein decoding comprises decoding the bit check instruction that indicates a value that identifies a bit position for the first bit as any one of a plurality of different possible bit positions.

17. The method of claim 15, wherein decoding comprises decoding the bit check instruction that indicates a enable control that is capable of being configured to cause the condition code bit to be updated in a same way regardless of whether the first bit equals or does not equal the check bit value.

18. The method of claim 15, wherein decoding comprises decoding the bit check instruction that indicates the first source operand which is to be a memory pointer.

19. The method of claim 18, wherein the first bit is a metadata bit of the memory pointer that is not used during address translation for identifying a physical memory location.

20. The method of claim 19, further comprising: controlling exception processing in garbage collection based on the condition code bit.

21. The method of claim 15, further comprising performing a control flow transfer instruction to make a control flow transfer to a garbage collector if the condition code bit indices the first bit does not equal the check bit value.

22. A system to process instructions comprising:
an interconnect;
a processor coupled with the interconnect, the processor to receive a bit check instruction that is to indicate a first source operand that is to include a first bit, and is to indicate a check bit value for the first bit, wherein the check bit value is one selected from a group consisting of implicit to the bit check instruction, specified by a field of the bit check instruction, and specified by an operand of the bit check instruction, the processor, in response to the bit check instruction, to compare the first bit with the check bit value, and cause a condition code bit to have a first value if the first bit equals the check bit value or a second, different value than the first value if the first bit does not equal the check bit value; and
a dynamic random access memory (DRAM) coupled with the interconnect.

23. The system of claim 22, wherein the bit check instruction is to indicate a value to identify a bit position for the first bit as being any one of a plurality of different bit positions.

24. An article of manufacture comprising a non-transitory machine-readable storage medium, the non-transitory machine-readable storage medium storing a plurality of instructions including a bit check instruction, the bit check instruction, if executed by a machine, is to cause the machine to perform operations comprising:
access a first source operand, which is to be indicated by the bit check instruction, the first source operand to include a first bit;
access a check bit value for the first bit, which is to be indicated by the bit check instruction, wherein the check bit value is one selected from a group consisting of implicit to the bit check instruction, specified by a field of the bit check instruction, and specified by an operand of the bit check instruction, wherein the first source operand is to be a memory address operand that is to have a plurality of least significant bits that are to be used to determine a memory address and a plurality of most significant bits that are to be available for use for one or more other purposes besides memory address determination, and wherein the first bit is to be one of the most significant bits;
compare the first bit with the check bit value in response to the bit check instruction;
update a condition code bit to indicate whether the first bit equals or does not equal the check bit value in response to the bit check instruction; and
controlling exception processing in garbage collection based on the condition code bit, wherein the first bit is a mark bit used in garbage collection.

* * * * *